United States Patent [19]
Albeck et al.

[11] Patent Number: 5,515,606
[45] Date of Patent: May 14, 1996

[54] METHOD FOR WIRING OF TERMINALS OF ELECTRICAL APPARATUS OR APPARATUS SYSTEMS

[75] Inventors: Bernhard Albeck, Lorch-Waldhausen; Herbert Emmerich, Waiblingen-Neustadt; Stefan Koller, Niederstotzingen; Hans-Peter Mews, Lüdenscheid, all of Germany

[73] Assignee: Vossloh Schwabe GmbH, Urbach, Germany

[21] Appl. No.: 190,131

[22] PCT Filed: May 25, 1993

[86] PCT No.: PCT/DE93/00455

§ 371 Date: Feb. 3, 1994

§ 102(e) Date: Feb. 3, 1994

[87] PCT Pub. No.: WO93/26147

PCT Pub. Date: Dec. 23, 1983

[30] Foreign Application Priority Data

Jun. 6, 1992 [DE] Germany .......... 42 18 741.9

[51] Int. Cl.[6] ............................................. H01K 3/10
[52] U.S. Cl. ............................. 29/850; 29/755; 29/861
[58] Field of Search .............................. 29/755, 861, 753, 29/850

[56] References Cited

U.S. PATENT DOCUMENTS 3,930,524  1/1976  Tarbox .
4,129,349  12/1978  von Roesgen .
4,271,573  6/1981  von Roesgen .
4,400,874  8/1983  Craver et al. .............. 29/755 X
4,461,061  7/1984  Rock .......................... 29/850 X
4,677,734  7/1987  Bloch et al. .
4,781,227  11/1988  Cross ......................... 29/755 X
5,033,188  7/1991  Polliard et al. ............. 29/861
5,156,557  10/1992  Okafuji et al. .

FOREIGN PATENT DOCUMENTS 2333361  6/1977  France .
1050855  2/1959  Germany .
1290210  3/1969  Germany .
1290215  3/1969  Germany .
3236868A1  5/1983  Germany .
3506797C1  4/1986  Germany .
3608243  9/1987  Germany .
3608243A1  9/1987  Germany .

*Primary Examiner*—Carl J. Arbes
*Attorney, Agent, or Firm*—Frishauf, Holtz, Goodman, Langer & Chick

[57] ABSTRACT

Wiring of terminals of electrical apparatus or apparatus systems (4, 5, 7) is done automatically in the course of the direct wiring. A preassembled electrical apparatus or apparatus system is made available with terminals (9, 10, 11) fixedly located in it, whereupon by means of an automatically guided line-laying tool (59), an endlessly supplied line (68) is moved into the contacting zones of the specially formed terminals, fixed there, and either clipped or through-wired.

27 Claims, 19 Drawing Sheets

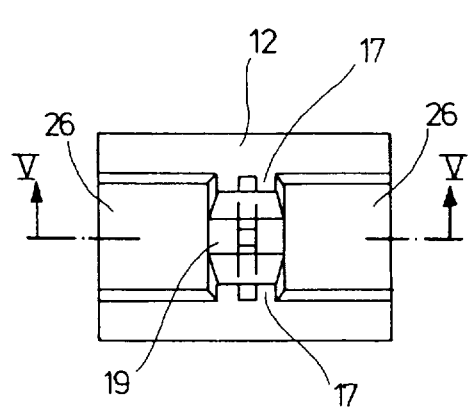
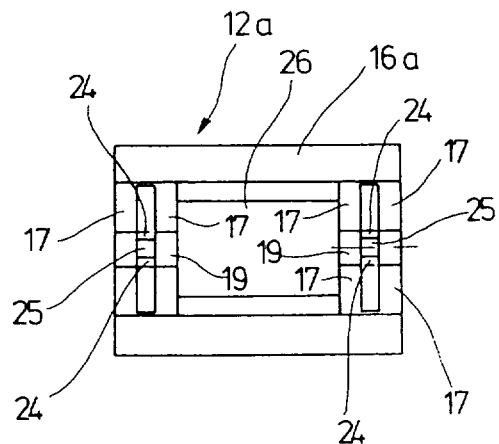
Fig. 3          Fig. 4
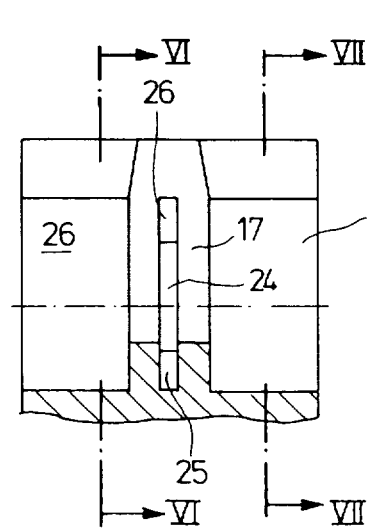
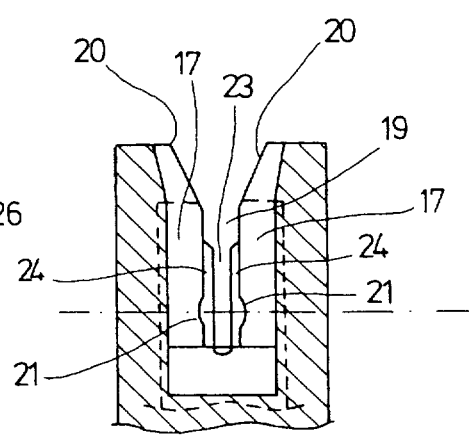
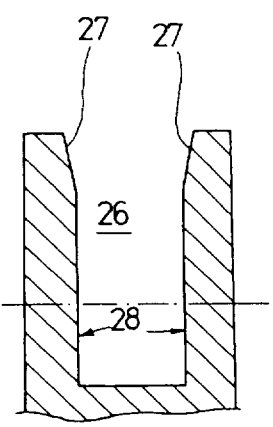
Fig. 5          Fig. 6          Fig. 7

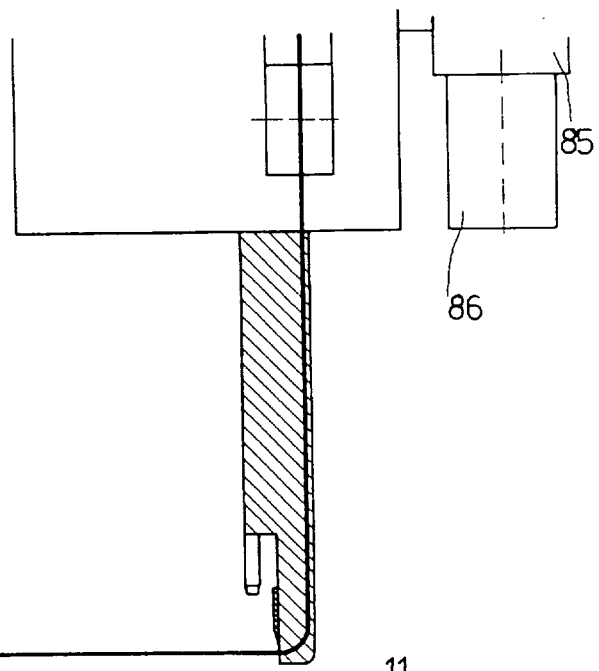
Fig. 23
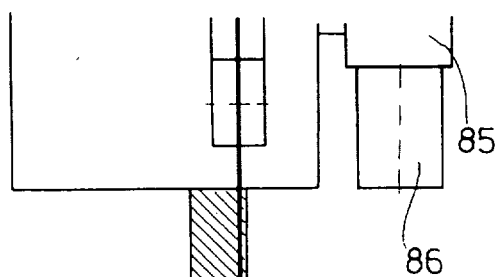
Fig. 24

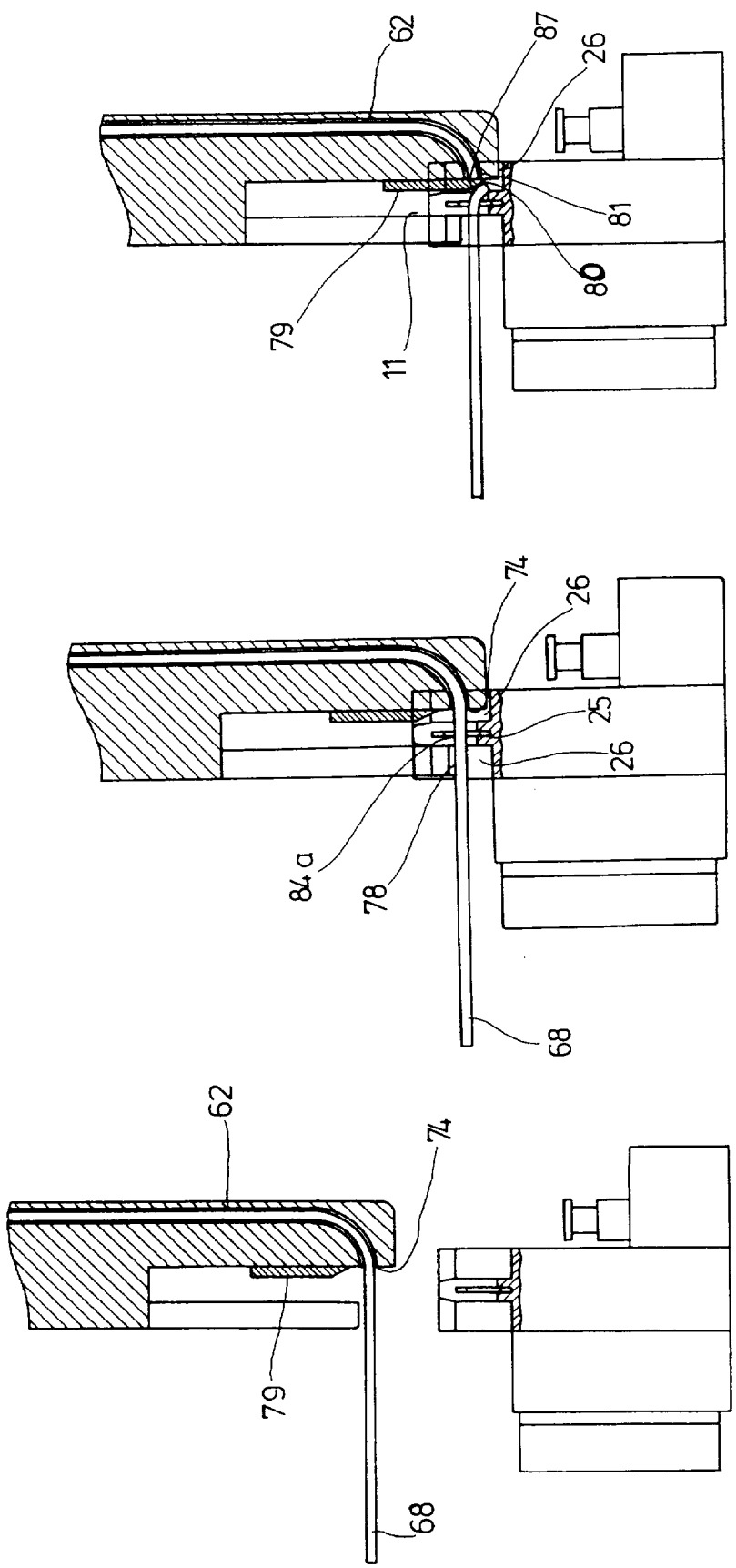

METHOD FOR WIRING OF TERMINALS OF ELECTRICAL APPARATUS OR APPARATUS SYSTEMS

FIELD OF THE INVENTION

The invention relates to a method for wiring of terminals of electrical apparatus or apparatus systems with the aid of controlled mechanical line-laying means, in particular line-laying means arranged for carrying out this method, and a terminal, formed for use in this method.

BACKGROUND

The term "wiring" is understood in the industry, in the case of electrical apparatus or apparatus systems, to mean the connecting of terminals to an electric line and the contacting of this line at the applicable terminal, in order to establish an electrical connection, for example with the associated switch element. This kind of wiring is required in the majority of electrical apparatus operating in the low-current range, including electronic switch control and regulating equipment and in apparatus systems, this latter overall term being understood to include in particular such elements as printed circuit boards, plug-in packages or modules, etc., which as available on the market are designed as units and are intended to be inserted into electrical apparatus. For the wiring itself, as a rule, switch wires, which are provided with a lacquer coating or a sheath of insulating material, or insulated flexible cables are used as the lines. Connecting the lines, which are insulated at the ends, in the contacting zone of the respective terminal is done using various known connecting techniques (such as screwing, plug-in connection, soldering, insulation displacement connection method of termination, and crimping). The operating steps required for the wiring are even today predominantly done by hand. This is time-consuming and frequently requires trained workers; the resultant expense is therefore considerable.

For the sake of more-rational production, particularly in relatively large-scale mass production of identical electrical apparatus, it is known to prefabricate the lines or to produce partial or complete cable harnesses, or in other words a typical preassembled product, first in a first region, separately from the electrical apparatus. In a second region, the insulation of this preassembled product in the applicable apparatus or end product is then done. This final assembly includes essentially the contacting or connecting of the various lines of the preassembled product to the contacting zones of the terminals and laying and securing the prefabricated lines or cable harnesses in the apparatus. While automated prefabricating devices are already in use for prefabricating the lines, the ensuing further processing of the lines that have been produced, for instance to produce partial or complete cable harnesses, and the operations directly at the wiring site are still virtually without exception done by hand.

A number of methods and apparatuses are already known for automatic production of cable harnesses (U.S. Pat. No. 4,677,734; German Patent Disclosures DE-OS 36 08 243, 36 11 805, 38 20 636, and 38 20 638; and Swiss Patent 598 740), all of which employ what are known as wire-laying boards and the like. However, all these methods require very major technical effort and expense, which can be considered only for relatively large-scale mass-production of equipment. In any case, with this technique the fundamental problem still remains that the final assembly of the prefabricated lines or cable harnesses involves considerable labor, and so the attainable rationalization effect remains limited. Moreover, the course of the lines in the apparatus must often be chosen with a view to the prefabrication of the lines or cable harnesses, and this means long laying paths with detours, branches, loops, and bi-directional motions of clamping devices.

THE INVENTION

The object of the invention is therefore to create a wiring method for electrical apparatus and apparatus systems that makes it possible to substantially rationalize wiring compared with known methods, while at the same time assuring high operating safety while lessening the possibilities for error in the wiring.

The new method assures rational complete automation of the wiring of electrical apparatus and apparatus systems. It makes it possible to dispense with prefabricated lines and partial or full cable harnesses, because it performs direct assembly of the lines in the apparatus or apparatus system. It is possible to contact a line in the form of an endless line to be contacted fully automatically to the terminals provided with suitable automation-appropriate contacting zones, lay it in a defined way in the wiring process between the terminals, and finally to cut it off. With this direct assembly of the line, the requisite electrical connections are automatically produced serially and completely. The capability of through-wiring, that is, connecting a plurality of terminals with one line, offers a substantial advantage. It is in fact possible to dispense with the plurality of lines previously needed for that purpose. This not only represents economy in terms of the number of lines but also avoids doubling up at terminals and multiple laying out of the same terminals, since the lines are mounted directly and paid-out from a supply and since as already noted, it is unnecessary to produce preassembled products, or in other words to prefabricate the lines, a very major rationalization effect is attained, while at the same time fewer changes in direction in the laying process itself are required. Branches, loops and the like that were previously needed with a view to the prefabrication of lines or combining lines into partial or full cable harnesses, are largely dispensed with. At the same time, in comparison with the prior art, there are fewer terminals, which increases the wiring safety and reduces the possibilities of error.

When long laying paths are structurally dictated, a support or retention location can also be brought into operating range of the line-laying means and positioned correctly relative to them by means of a relative motion between the preassembled apparatus or apparatus system; in that case, by means of the line-laying means, the line can be inserted into a line mount at the support or retention point and secured there. From this support or retention point, the line is then, in the next direct wiring operation, carried to the next terminal, at whose contacting zone it is again contacted and clipped as needed.

In the new method, both the beginning and the end of the line as well as a continuous line can be contacted at the corresponding successively contacted terminals. Since the beginning of the line is fixed at the terminals at the onset of laying a line, the tensile relief required in direct laying of the line can be attained simply in that the line length paid out during line-laying between two terminals by the line-laying means is automatically synchronized with the relative motion between the preassembled apparatus or apparatus system and its line-laying means. The line length paid out by the line-laying means may be dimensioned as long enough that the line laid between the terminals is completely free of tensile strain. If necessary, this line can also readily be laid with an excess line length, for example so that it sags. If it should be desirable in individual cases for the line laid between two terminals to be kept at a certain tensile strain, then this can also be achieved by a simple suitable adaptation of the line-laying means to the aforementioned relative motion between the preassembled apparatus or apparatus system.

For practical performance of the new wiring method it is advantageous if upon the relative motion between the preassembled apparatus or apparatus system in the line-laying means, the line-laying means merely come into the vicinity of the applicable terminal, whereupon next the line-laying means, in a positioning motion, are positioned precisely correctly relatively to the terminal. In this way it is attained that the displacement motion of the line-laying means, taking place along the path corresponding to the predetermined laying course, need not meet overly stringent requirements for accuracy, while at the same time, exact prepositioning of the terminals themselves or of the components carrying them in the electrical apparatus or electrical apparatus system becomes unnecessary. The positioning motion required for exact positioning can be imparted to the line-laying means, which have been brought to the vicinity of the applicable terminal, in direct cooperation between a laying tool of the line-laying means and the suitably designed terminal, or a guide device provided on it, to mention a quite simple possibility. The procedure may also be such, however, that with the line-laying means brought to the vicinity of the terminal, the positional deviation of the line-laying means from the position of the terminal is ascertained with position sensing means, and the positional deviation is then automatically compensated for. Sensing means that are intrinsically arbitrary may be used to ascertain the positional deviation. An image processing system assigned to the line-laying means has proved to be especially practical for this purpose; to take pictures, it is moved near the terminal, and it has means for image evaluation, in which the compensation for the positional deviation is calculated, whereupon a corresponding control signal is output that is evaluated for controlling a motion device of the line-laying means.

The relative motions between the preassembled apparatus or apparatus system and the line-laying means that are required in carrying out the new wiring method in the course of the direct wiring can in principle be produced in various ways. For instance, the line-laying means may be moved by a multiaxially movable manipulator or industrial robot, whose motion is programmable in at least one axis. The preassembled apparatus or apparatus system is then located prior to the beginning of the wiring in a stationary position within the operating range of the manipulator or industrial robot. The latter is assigned a suitable control unit, in which the course coordinates required for the laying courses are programmed, such that the line-laying means execute the moving and positioning motions necessary in the operating process, and by means of suitable system components (sensor system, etc.), perform further functions, such as the aforementioned positional tolerance compensation, by means of suitable system components (sensor system, etc.).

Alternatively, however, the procedure may be such that the line-laying means are stationary or located at a positioning device that imparts merely a positioning motion to them, while the preassembled electrical apparatus or apparatus system is moved by means of a transport means movable relative to the line-laying means. The transport means is again connected to a programmable control unit, which makes it possible to fully automatically achieve the appropriate laying courses for the directly wired lines. The outcome of the work is therefore the same. Which of these two kinds of procedure will be chosen in a given case depends, among other factors, on the type of apparatus or apparatus system to be wired.

The relative motion between the preassembled apparatus or apparatus system, produced in the manner described for the direct wiring, can intrinsically be chosen arbitrarily as a function of local conditions within the apparatus or apparatus system, and even curved laying courses are possible. As a result, however, it is practical if this relative motion is at least intermittently substantially rectilinear, so that at least intermittently straight laying courses result.

Forming the contacting zones at the various terminals must be done in a way suitable for automation; that is, the line-laying means must be capable, after their positioning at the applicable terminal, of introducing the line into and contacting it in the applicable contacting zone fully automatically. As has been recognized, this requirement can be met especially simply by using contacting zones that have contact means operating by the principle of the insulation displacement connection or contact (IDC) method, or IDC technique; the line is pressed into the contact means by the line-laying means, producing the electrical contact. The IDC technique produces a very high-quality electrical connection of the electric conductor of the line to be connected and the contact means, because it brings about a large-surface area, gas-tight contacting in the manner of a cold weld. Since the conductor is contacted immediately after the insulation is cut, oxidation of the conductor surface cannot occur as it does if the line ends are first insulated-off, or stripped in a separate operation prior to the contacting. For fixation, the line upon being pressed in suitably firmly is clamped on at least one side of the IDC contact means. The pressing-in itself is advantageously done such that a pressing-in force is exerted upon the line on both sides of the IDC contact means, so that upon being pressed in, the line remains perfectly aligned and is reliably both contacted and firmly clamped.

If through-wiring does not occur at the particular terminal, then the line is clipped immediately at the line-laying means or, by suitable formation of the IDC contact means, directly at the line laying means; at the same time, shock-hazard protection for the contacted line end is produced. Since stripping of its own insulation is not provided, there will be a savings at each terminal compared with other connection techniques of a small length of line, which over the length of line required for the entire wiring represents a noticeable economy.

As already referred to at the outset, the new fully automatic method of direct wiring can be employed without prefabrication of lines etc. in intrinsically all apparatus and apparatus systems. However, it has been found that a very valuable application is to employ it for automatic wiring of lighting fixtures or parts thereof. Such lighting fixtures in fact have a relatively large light box, whose dimensions are chosen with a view to the luminous bodies to be accommodated in it, such as gas discharge lamps, etc., and also have some standardized associated network elements such as ballasts that are accommodated in the light box. Wiring of the terminals of these net work elements is often done entirely manually at present; this is expensive and difficult.

The novel wiring method is carried out with suitably defined line-laying means, which make it possible to carry out the various functions required for the operating process. An especially suitable embodiment of such line-laying means in accordance with the invention forms an improvement over the line-laying tools known from German Patent Disclosures DE-OS 36 06 059, 36 11 805 and 38 20 636.

The stated object is to create line-laying means that particularly in the new direct wiring method assure fully automatic, satisfactory fixation and contacting of the line to the particular terminal.

To attain this object, the laying tool included in the line-laying means has, according to the invention, includes a pressure member, located in the vicinity of the mouth of the guide conduit or guide tube of the line, for the line emerging from the mouth. The line in this region can be pressed into the contacting zone of the terminal in such a manner that it is aligned and perfectly supported. High wiring safety in the region of the terminals can thus be assured, while at the same time no remachining whatever is needed. The contacting zone of the terminal is as a rule formed by the aforementioned IDC technique, but the new tool can in principle be used for other connection techniques as well where it is crucial for a conductor end or conductor piece to be introduced and in particular pressed in a predetermined orientation exactly into a slit or into a corresponding receptacle of a clamping device present at the particular terminal.

In an advantageous embodiment, the pressure member is a ram guided longitudinally displaceably along the housing or along a part of the laying tool connected to it; as a rule, the ram is located parallel to and spaced apart from the so-called laying prong of the laying tool, the prong likewise being formed as a ram, so that the conductor on being pressed into the contacting zone is supported at two points spaced apart from one another by the same distance. The mouth of the guide conduit or tube of the laying tool is suitably located laterally on the laying prong on the side toward the pressure member, and the pressure member and the laying prong may have at least in some regions an essentially equal width, measured transversely to the longitudinal width of the conductor emerging from the mouth of the guide conduit or guide tube. A very simple design of the terminal can thus be achieved.

In order to clip the line at a terminal, an IDC contact may for instance used, which has a clipper edge that becomes operative when the conductor is pressed into the contacting zone. In that case it suffices to provide the aforementioned pressure member on the laying tool. If this kind of clipper edge at the terminal is dispensed with, then it is advantageous if controlled clipper means for the line are provided on the laying tool that have at least one movable clipper blade in the region between the mouth of the guide conduit and the pressure member. This clipper blade may be supported so that it acts directly at the laying finger, with the edge of the mouth of the guide conduit being formed as a counterpart knife. Clipping of the conductor can be done either next to the contacting zone or directly within the contacting zone itself.

Finally, the laying prong of the laying tool is as a rule fixedly located on the housing thereof, or on a part connected to it; however, it may also be supported movably and coupled to its own adjusting means.

As already explained, the new method for direct wiring can be carried out especially simply using terminals whose contacting zones are designed in accordance with the so-called IDC technique. This technique is explained, for instance in the journal entitled "Messen+Pr üfen/Automatik" [Measurement+Testing/Automatic Systems], July/August 1982, pp. 491, 492; the design of corresponding IDCs or IDC contacts may be learned for instance from German Utility Model DE-GM 88 04 388, published French Patent Application 2 330 159 and U.S. Pat. No. 2,501,187. Based on this prior art, the stated object is to create a terminal for use in the method referred to above, using the aforementioned line-laying means, that is designed such that in a simple, effective way it assures operationally safe contacting and fixation of the connected line and at the same time does not hinder carrying out the method automatically.

The terminal is formed, according to a feature of the invention with a slitlike or groovelike indentation provided on the housing of the clamping terminal means. This assures on the one hand shock-hazard protection of the clipped end of the line, without requiring additional method steps or provisions for that purpose. Secondly, if necessary, it can also provide centering of the laying prong and/or pressure member of the laying tool upon introduction of the line into the contacting zone. The IDC contact itself that is used then upon introduction of the line brings about a certain automatic height compensation, because the only critical point is that the conductor be received firmly in the IDC seat with a certain height tolerance range.

The introduction slit in the housing at the terminal may have a width that brings about a clamping fixation of a pressed-in line, so that the line is fixed independently of the actual contacting zone. The indentation in the housing may also be defined on both sides of IDC contacts or located on one or both sides of an IDC contact.

DRAWINGS

In the drawing, with respect to an example, are:

FIG. 1, in a perspective schematic view, a preassembled light box of a fluorescent light fixture, to be wired by the method of the invention;

FIG. 2, in a fragmentary perspective view on a different scale, the terminals, formed in the according with the invention, of a fluorescent lamp ballast choke for the light box of FIG. 1;

FIG. 3, a fragmentary plan view on a different scale of a terminal of the arrangement of FIG. 2;

FIG. 4, a plan view corresponding to FIG. 3 of a terminal of the arrangement of FIG. 2, in a modified embodiment;

FIGS. 5–7, side views in section taken along the line V—V of FIG. 3, and line VI—VI and line VII—VII of FIG. 5, respectively, of a clamping terminal of one of the terminals of the arrangement of FIG. 2;

FIG. 8, a schematic perspective view on a different scale of the terminals, formed according to the invention, of the clamping block of the light box of FIG. 1;

FIG. 9, in a perspective view on a different scale, the terminals formed according to the invention of a lamp socket of the light box of FIG. 1;

FIG. 10, a schematic side view of an apparatus for carrying out the method of the invention with the aid of an industrial robot;

FIG. 11, a plan view of the device of FIG. 10;

FIG. 12, a schematic side view of a device for carrying out the method of the invention with the aid of a portal manipulator;

FIG. 13, a schematic side view of a further embodiment of a device for carrying out the method of the invention, using a manipulator, with a movable transport table;

FIGS. 14–20, a schematic detail view of the laying tool of the device of FIGS. 10 and 11 showing its association with the terminal of a fluorescent lamp choke of the light box of FIG. 1, illustrating various chronologically successive phases in the course of the method of the invention upon connecting the endlessly supplied line to the first terminal;

FIGS. 21–29, each in a corresponding view, the arrangement of FIGS. 14–20, showing chronologically successive steps of the course of the method after the fixation of the end of the line, during laying of the line to the next terminal, upon contacting, and ensuing clipping of the line at that terminal;

FIG. 30, in a schematic plan view and on a different scale, the light box of FIG. 1 in the wiring state after the conclusion of the segment of the wiring illustrated by FIG. 14–29;

FIGS. 31–33, in views similar to FIGS. 14–19, the line-laying means of the device of FIGS. 10 and 11 in association with a further fluorescent lamp choke of the light box of FIG. 1, illustrating chronologically successive steps in the course of the method of the invention in producing the next wiring segment; and FIG. 34, the light box of FIG. 30, in the state after the production of the wiring segment produced by the method of FIGS. 31–33.

DETAILED DESCRIPTION

Figure 1:
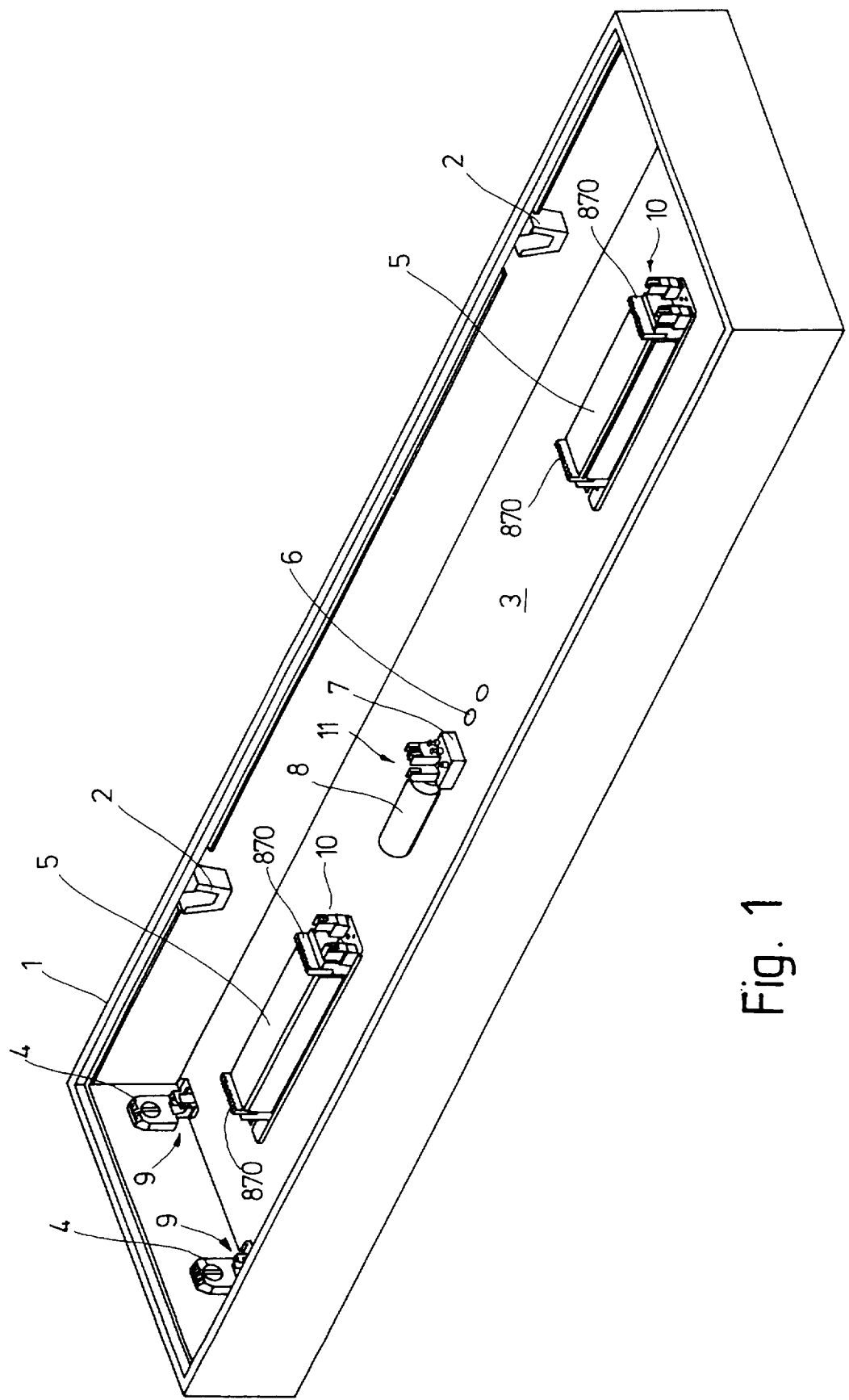

The method for direct wiring of electrical apparatus elements, and circuit components of our apparatus systems will be described below in conjunction with the wiring of a rectangular light box 1, shown in FIG. 1, for two rod-shaped gas discharge tubes e.g. fluorescent light bulb, not shown in further detail. For operation the light box is covered with a transparent or translucent acrylic glass hood or reflector, which is clamped in place in mounts or retainers 2 and not shown in further detail.

The light box has already been pre-assembled to the extent that the necessary electrical circuit elements for receiving and operating the gas discharge lamps have been secured in the correct positions by a predetermined location plan fixedly to the box bottom 3, for instance being screwed in place. In detail, four lamp sockets 4 of a known construction are provided in the vicinity of the end walls of the box, each in pairs facing one another, and two magnetic fluorescent lamp chokes or ballasts 5 are assigned to each pair and are located on approximately the center line of the box bottom 3, on either side of line introduction openings 6, at equal intervals from the end walls of the box. An insulating material base 7 that carries a capacitor 8 is secured to the box bottom 3, also located on its center line, next to the line introduction openings 6. Terminals for electric supply lines are provided on each of the lamp sockets 4, ballasts 5 and insulating material base 7; these terminals are identified by reference numeral 9 for the lamp sockets 4, reference numeral 10 for the ballasts, or chokes, and reference numeral 11 for the base 7 of insulating material of capacitor 8. These terminals 9, 10, 11 are all designed by the same basic principle with a contacting zone in accordance with the IDC technique. Their form can be seen in detail from FIGS. 2 through 9; it will be described below in particular in terms of the terminal 10 of a choke 5, with reference to FIGS. 2 through 7:

Each terminal 10 has a housing 12, made of insulating material and of essentially rectangular cross section, which is placed on a base part 13, likewise produced from insulating material, resulting in a unit-type connection clamping terminal that is secured at 14 to a stamped, upward-bent tab of a baseplate 15 of the choke 5. The two side walls 16 of the housing 12, which is open at the top, have on their inside to formed-on ribs 17 opposite one another, which are located approximately in the middle between the two face ends 18 of the housing 12 and between them define a slightly wedge-shaped or parallel-sided introduction slit 19 (FIG. 6), which is widened on its top by means of introduction bevels 20. In its lower region, the introduction slit 21 is locally widened somewhat in a region in the shape of part of a circle.

Two narrow grooves 22 facing one another extend into the ribs 17 from below to approximately the height of the introduction bevels 20; they receive the two legs 24, defining an IDC slit 23 open at the edge, of an IDC contact 25 made from spring steel or spring bronze. The narrow, essentially U-shaped IDC contact 25 in the form of a small plate is embedded on all sides in the insulating material of the housing 12 except for the clipping segments formed at the legs 24 and oriented toward the IDC slit 23; both legs 24 are limitedly movably guided in the grooves 22. In a manner not shown in further detail, one end of the winding of the choke 5 is connected to the IDC contact. Together with the IDC slit 23, the IDC contact forms the contacting zone of the terminal 10.

As can be seen particularly from FIGS. 3 through 7, the housing 12 has one groove-like indentation 26 of rectangular cross section each on either side of the ribs 17 and hence adjoining the introduction slit 19, each indentation being open toward the top of the housing 12 next to the introduction slit 19. The two groove-like indentations 26 are located in alignment with one another and with the introduction slit 19. They are likewise defined toward the top by an introduction bevel 27. FIGS. 5, 7 show that the depth of the groove-like indentations 26 is greater than the depth of the introduction slit 19, and that its width 28 is also substantially greater than the width of the introduction slit 19.

The dimensions of the individual parts are selected such that for an insulated conductor pressed in through the introduction slit 19, the insulation is cut open in the IDC slit 23 by the legs 24 of the IDC contact 25, and at the same time a gas-tight contacting takes place between the IDC contact 25 and the conductor that is deformed at the clamping point. The pressed-in conductor is simultaneously firmly clamped by its insulation in the introduction slit 19 between the two ribs 17, and the widening at 21 serves to assure that the line will lock into place in detent fashion at its insulation upon being pressed into the introduction slit 19. The thus-fixed, connected line extends through one of the groovelike indentations 26 (FIG. 2), while its clipped end is located in the other groovelike indentation 26, as will be described in further detail hereinafter. The width and depth of the groove-like indentations 26 and their axial length are dimensioned such that contact protection is automatically produced for the clipped end of the line. This means that a standardized sensing prong, in the test for shock-hazard protection, cannot penetrate as far as the bared, clipped end at the depth of the associated groovelike indentation 26.

In the embodiment of the housing 12 described, two groovelike indentations 26 aligned with one another are provided, one on either side of the introduction slit 19, and their width and depth are substantially larger than the diameter of the line to be received. It is also conceivable to leave out one of the groovelike indentations 26, which is particularly worth considering if the line is merely being laid continuously through the terminal, as will also be described in further detail below. In individual instances, both groovelike indentations 26 may even be omitted.

FIG. 4 shows a modified embodiment of the housing 12 in plan view: In this embodiment, only one groovelike indentation 26 is present, which is defined in the housing 12a on both sides by one pair 17 of ribs each with an intervening introduction slit 19 and by a contact element 25 protruding into the slit with its legs 24. The pairs of ribs are each formed on flush at the ends with the side walls 16a in the housing 12a and are aligned by their introduction slits 17 with the longitudinal axis of the groovelike indentation 26.

Figure 2:
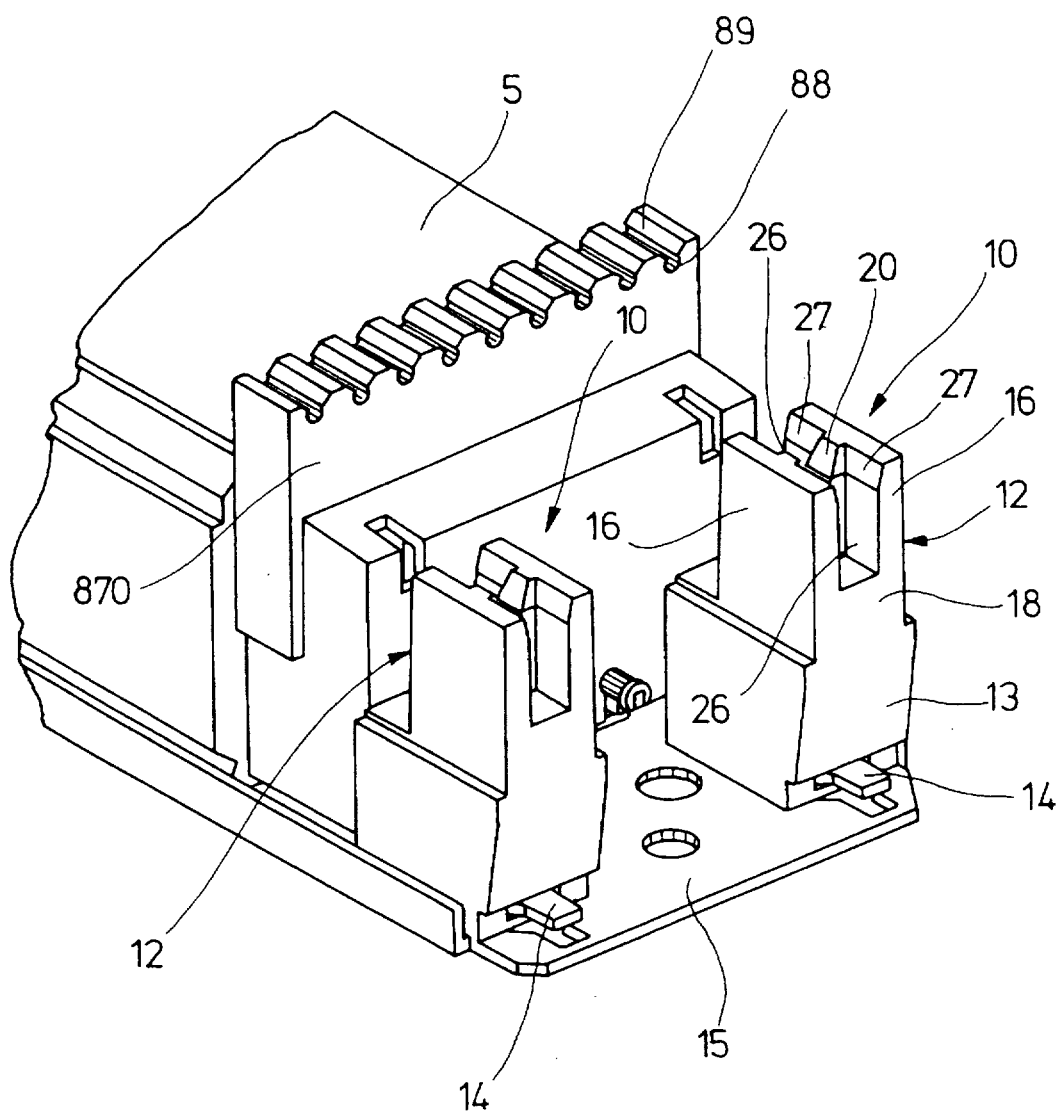

While in the embodiment of FIGS. 2 and 3 a clipped end of a line is located next to the contacting zone formed by the IDC element 25 (see FIGS. 27–29, for instance), in the embodiment of FIG. 4 it is assured that the clipped end will be located in the contacting zone defined by the two IDC contacts 25, or in other words inside the housing 12a that is closed on all sides except for the introduction slit.

Figure 8:
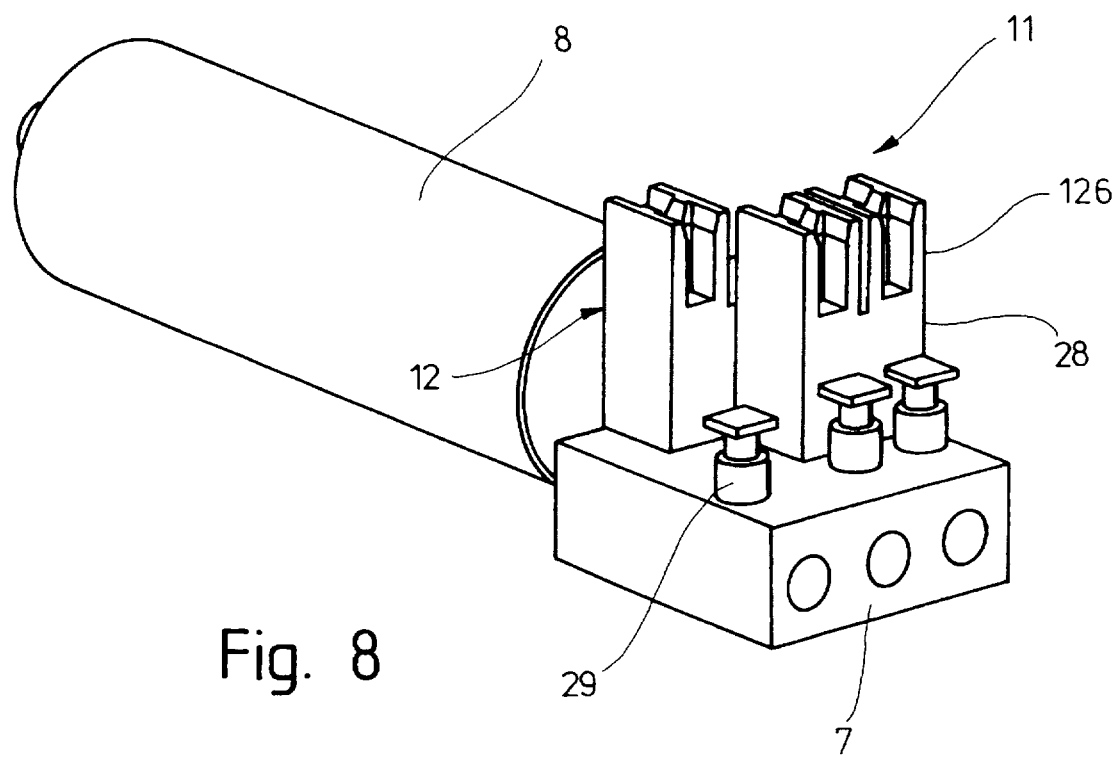

The terminals 11 located on the insulating material base 7 are fundamentally formed identically to the terminals 10, as can be learned from FIG. 8. Reference is therefore made to FIGS. 2–7 in terms of their description. Identical elements are identified by the same reference numerals.

A total of three terminals 11 are located on the insulating material base 7; two of them are combined into a connection clamp unit marked 28, which has a unitlike housing 12b. Clamps are indicated at 29 for internal connection to the terminals of the capacitor 8.

Figure 9:
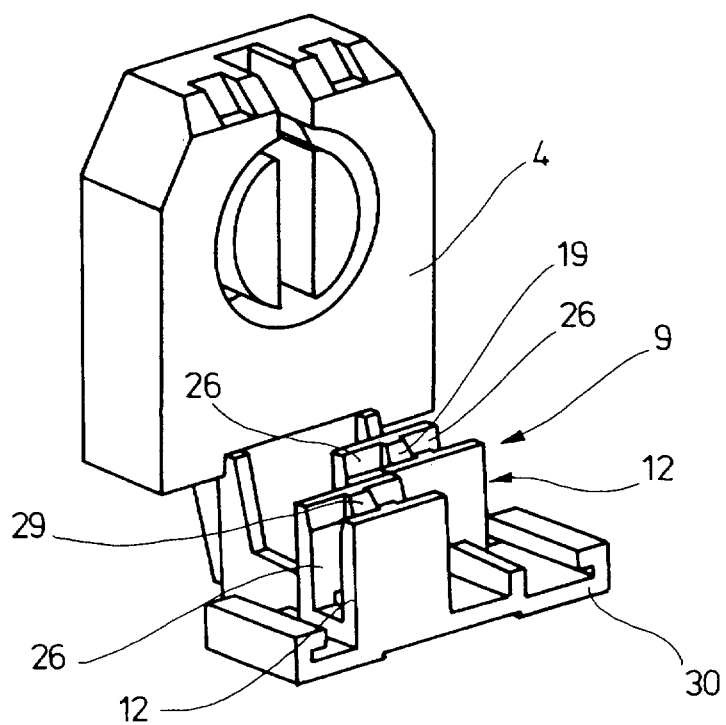

The terminals 9 of the lamp sockets 4 are also fundamentally equivalent to the terminals 10 of FIGS. 2 and 3 in design. In FIG. 9, identical elements are therefore again provided with the same reference numerals and reference is made to the description of FIGS. 2 and 3.

While for the terminals 10, 11 (FIGS. 2, 8) the housings 12, 12b are however located with their introduction slits 19 and the groovelike indentations 26 pointing longitudinally of the choke 5 or starter 6 and hence longitudinally of the light box bottom 3 (FIG. 1), the arrangement for the lamp sockets 4 is made such that the housings 12 are secured on a fastening base 30 of the respective lamp socket 4, with introduction slits 19 and groovelike indentations 26 extending transversely to the longitudinal direction of the gas discharge lamps to be used and hence of the lamp box bottom 3. In the lamp sockets 4, lines to be connected must therefore be pressed into the introduction slit 19 in such a way that they extend at right angles to the longitudinal direction of the lamp box 3.

Figure 10:
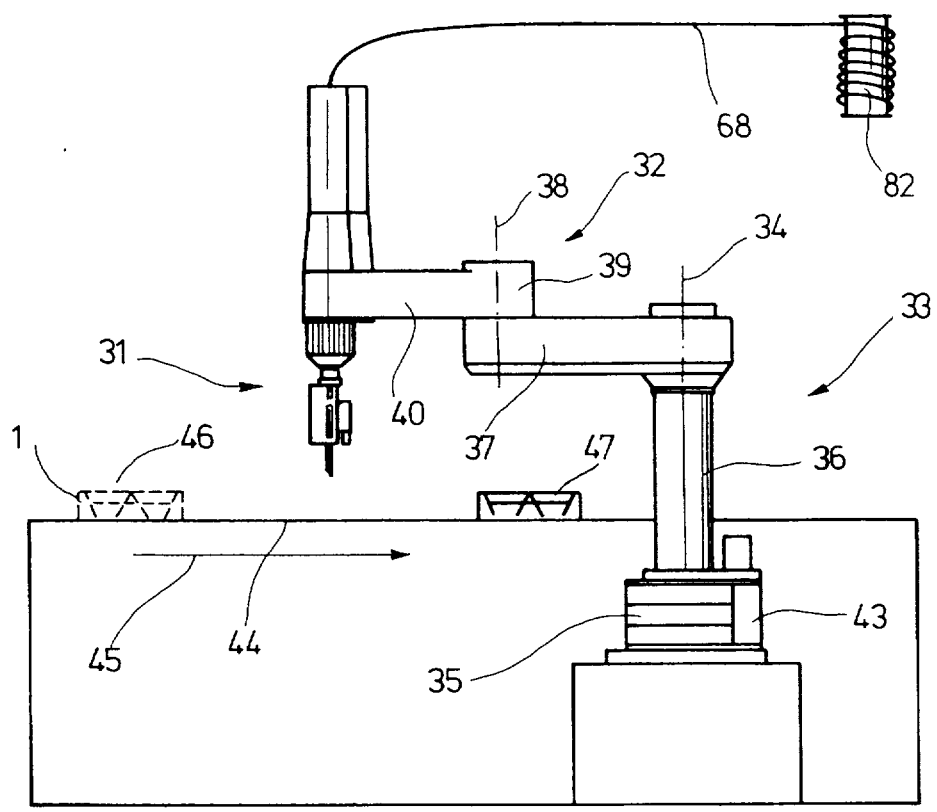
Figure 11:
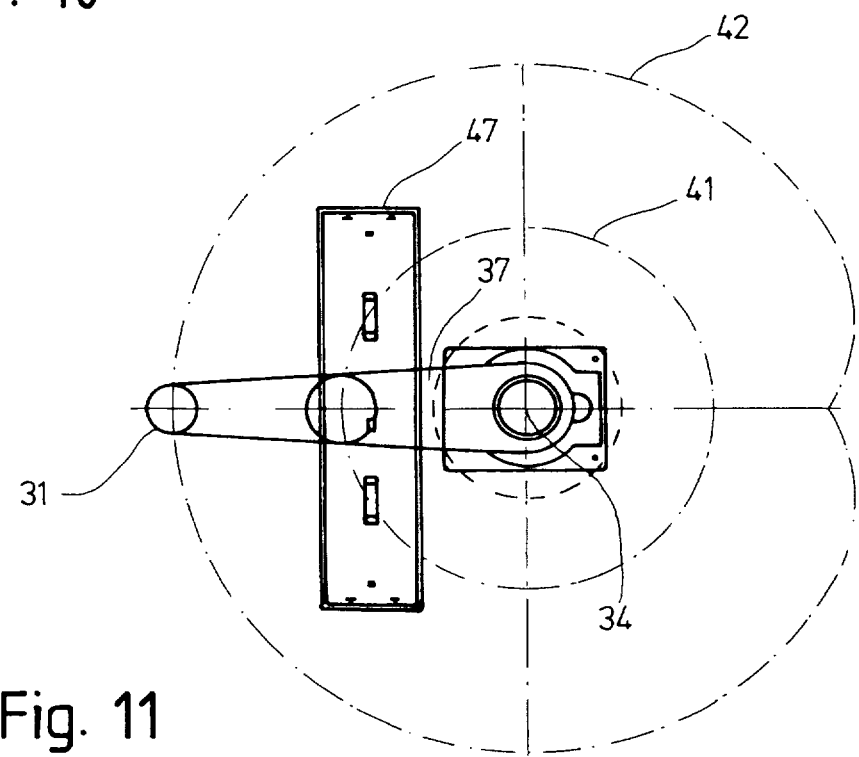
Figure 12:
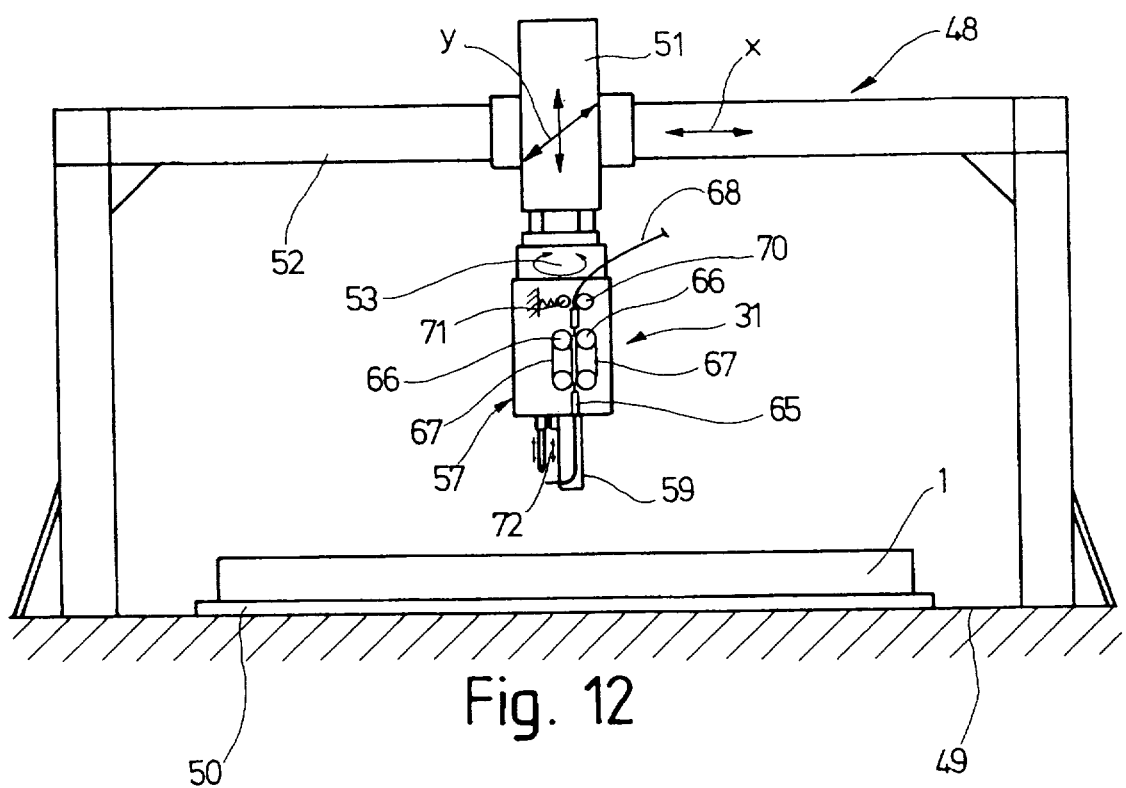
Figure 13:
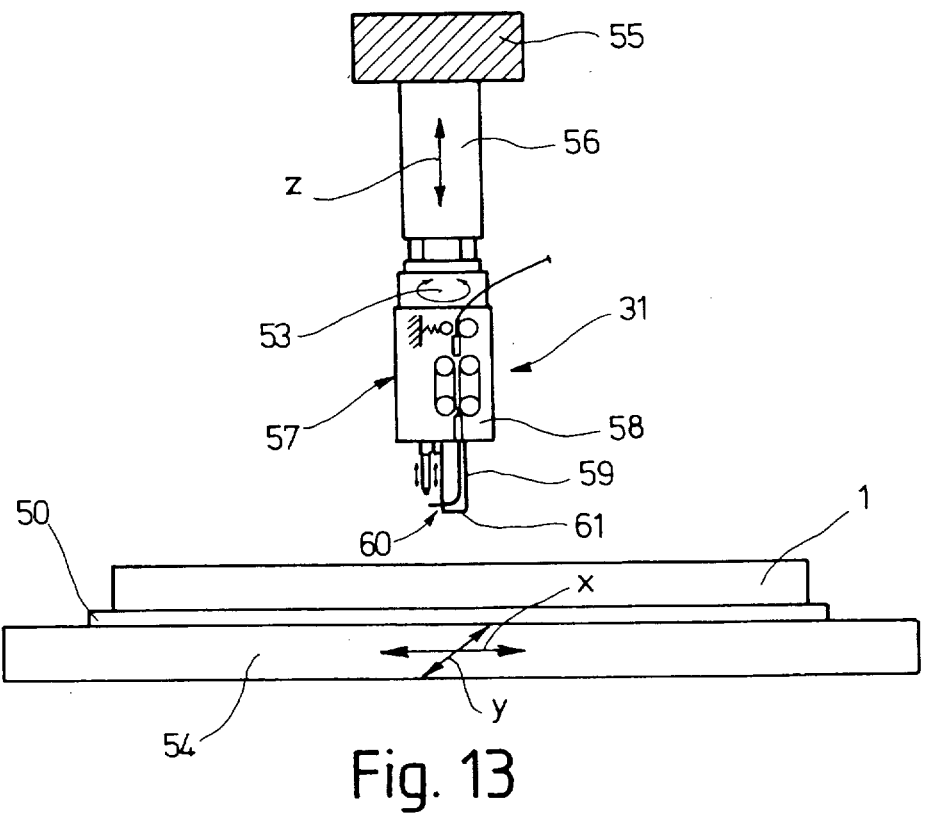

The wiring of the light box 1, described thus far in terms of its circuit elements 4, 5, 7 and their terminals 9, 10, 11, is done with the aid of an industrial robot as shown in FIGS. 10, 11 or a manipulator as shown in FIGS. 12, 13 that moves the line-laying means, as will be described below in conjunction with FIGS. 13 ff:

The line-laying means, identified overall by reference numeral 31, are seated in the apparatus of FIGS. 10, 11 on the two-piece arm 32 of an industrial robot 33, which has a column 36 rotatable about a first stationary vertical axis 34, for instance by a stepping motor drive 35, and the column carries a first arm piece 37, which in the region of its free end is connected, via a swivel bearing 39 that forms a vertical second pivot axis 38 parallel to the first pivot axis 34 and is provided with an incremental rotational drive, to a second arm piece 40, which carries the line-laying means 31 on its outer end. The two drives 35, 39 can move the second pivot axis 38 along a circle 41 about the first pivot axis 34 and in the extended state of the arm 32 can move the line-laying means 31 along an essentially circular path curve 42; a reciprocating drive 43 associated with the drive column 36 enables a controlled vertical raising and lowering motion of the arm 32 and thus of the line-laying means 31. The industrial robot 33 is assigned a stationary work table 44, with a transport mechanism integrated in it as suggested by an arrow 45 (FIG. 10), which mechanism makes it possible, on the horizontal work surface of the work table 44, to move successively preassembled light boxes 1 of FIG. 1 from a remote readiness position at 46 (FIG. 10) to the operating range of the line-laying means outlined by the essentially circular path curve 42, as is indicated at 47 by the working position of the light box 1 shown in FIGS. 10, 11. In this working position 47, the light box 1 is firmly clamped to the work table 44 in the correct position. The associated clamping means are of a known type; they are not further shown in FIGS. 10, 11. Within its operating range, the line-laying means 31 can be moved by the programmable industrial robot 33 to any arbitrary location inside the light box 1 and can be moved along any preprogrammed, defined course inside the light box 1.

The situation is fundamentally the same if the portal manipulator 48 shown in FIG. 12 is used, in which the preassembled light box 1 is firmly fastened in the correct position on a light box receptacle 50 on a stationary work table 49, and the line-laying means 31 are located on a carriage 51 that is supported on a portal 52 in such a way that it can be freely programmably moved both in an X direction represented by a double arrow in the longitudinal direction of the light box and in a Y direction, again represented by a double arrow, extending transversely to it. Moreover, the line-laying means 31 are rotatably supported on the carriage 51 about a vertical pivot axis 53 (c axis). Each of the axes of motion X, Y, c, like the reciprocation axis (z), are assigned their own incremental stepping drives, which being triggered by a freely programmable control unit can move the line-laying means 31 to any arbitrary point along a particular preprogrammed course within the fixedly clamped, preassembled light box 31.

Finally, the relative motion between the line-laying means 31 and the preassembled light box 1 required for line laying, or in other words for laying the terminals 9, 10, 11 of the preassembled light box 1, can also be attained with the apparatus of FIG. 13. Here the preassembled light box 1 is clamped to an XY table 54 by means of the light box receptacle 50; the axes of motion X, Y of this table are each represented by double arrows. The line-laying means 31 are carried by a positioning device 56, located above the XY table 54 on a stationary carrier 55; this device is capable of imparting a reciprocating motion in the Z direction (represented by a double arrow) and a rotational motion about the vertical axis 53 (c axis) to the line-laying means 31. In this case as well, incremental drives for motion in the XY axis or the zc axis are assigned to the XY table 54 and the positioning device 56 and are triggered by a freely programmable control unit, in such a manner that the line-laying means can be moved to any arbitrary site within the light box 1 along the particular programmed course.

The line-laying means 31 in turn have essentially a so-called line laying tool 57 with an optionally multiple-part housing 58, which is secured to the arm 32 of the industrial robot 33 (FIG. 10) or to the carriage 51 (FIG. 12) or to the positioning device 56 (FIG. 13). A vertical laying prong 59 of substantially rectangular cross section is located on the underside of the housing 58 and includes an L-shaped curved line guide conduit 62, which opens out in the region of a side wall at 60, a short distance from the flat bottom face 61 of the laying prong 59. The line guide conduit 62 (FIG. 14) contained in the laying prong 59 is extended in the housing 57 in the form of a guide tube 65, to which a belt drive for a line suggested at 68 and comprising two pairs 66 of belt rollers (FIGS. 12, 13) and endless drive belts 67 wrapped around them, is assigned.

The belts 67, each guided by one side parallel to one another and a slight distance from one another are coupled via the belt rollers 66 to an incremental drive that imparts a controlled drive motion to them that is synchronized with the relative path motion between the preassembled light box 1 and the line-laying means 31; this motion can be generated when the wiring is done by the devices of FIGS. 10–13.

A measurement system preceding the belt drive for the line 68 and comprising a measuring wheel 70 and a drive roller 71 elastically prestressed in the engagement position makes it possible to measure the exact feed motion of the line 68, regardless of the slip that occurs between the endless belts 67 of the belt drive, so that perfect synchronization of the line feeding with the displacement motion of the robot 33, the manipulator 48, or the XY table 54.

The laying prong 59 is as a rule rigidly secured to the housing 57; it may, however, also be supported so as to be raisable and lowerable in the vertical Z axis and provided with a suitably triggerable adjusting device inside the housing 58. This is suggested by a double arrow 72 in FIG. 12.

Figure 14:
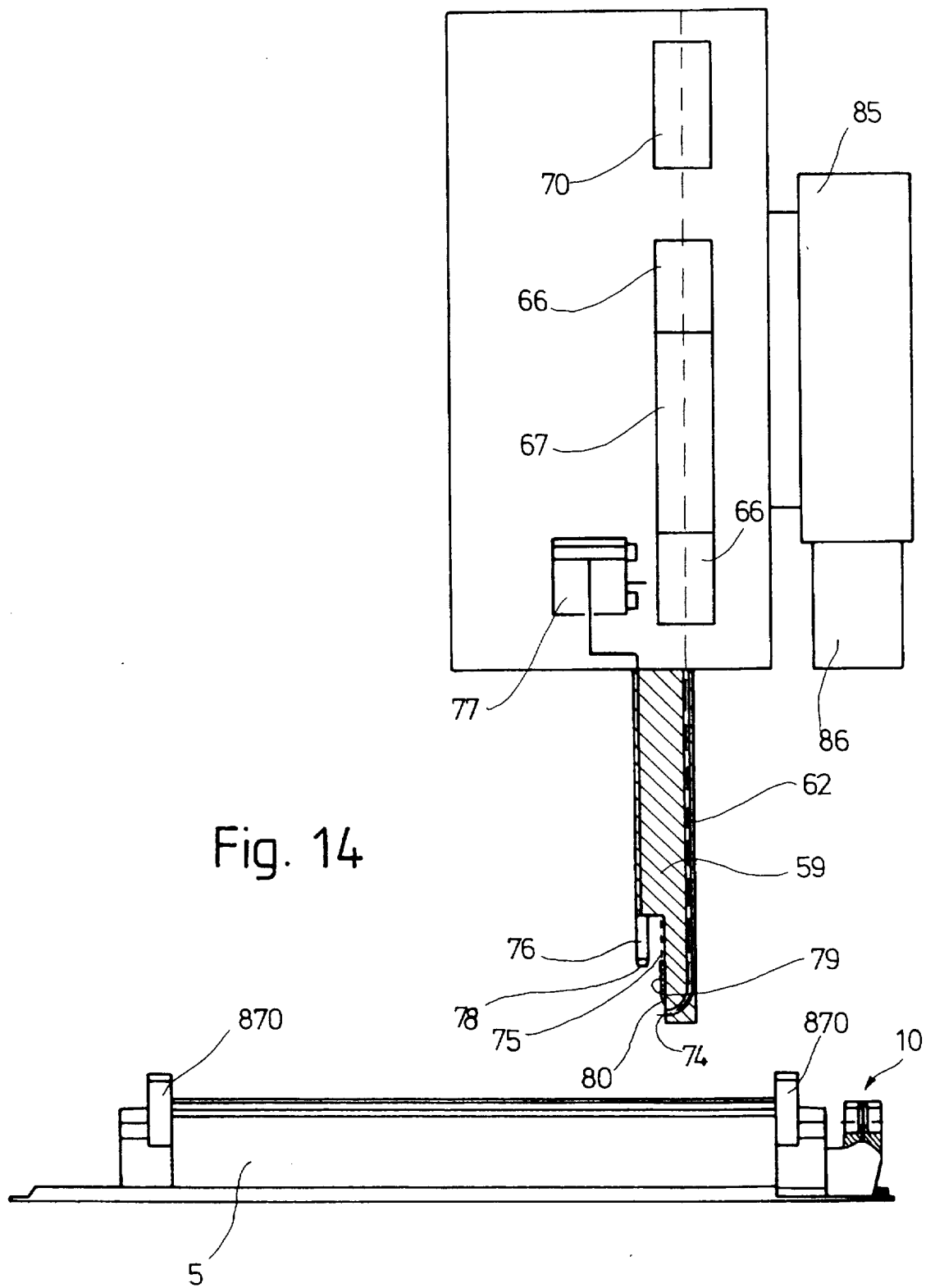

As can be seen for instance from FIG. 14, a pressure member movable vertically in the Z axis of a displaceable ram 76, which is raisable and lowerable via an associated control drive in the interior of the housing 58, is located laterally spaced apart from the vertical, flat side face 60 of the laying prong 59 that contains the mouth 74 of the line guide conduit 62—or on the housing 58 itself as in FIGS. 12, 13. The motion of the ram 76 is controlled by program by the control unit as a function of the displacement motion of the line-laying means 31. A sensor 77 (FIG. 14) coupled to the ram 76 outputs a check-back signal indicating the position attained by the bottom face, acting as a pressure face 78, of the ram 76 to the control unit, so that an exact adjustment of the height of the bottom face 78 of the ram 76 relative to the mouth 74 of the line guide conduit 62 is possible.

Figure 15:
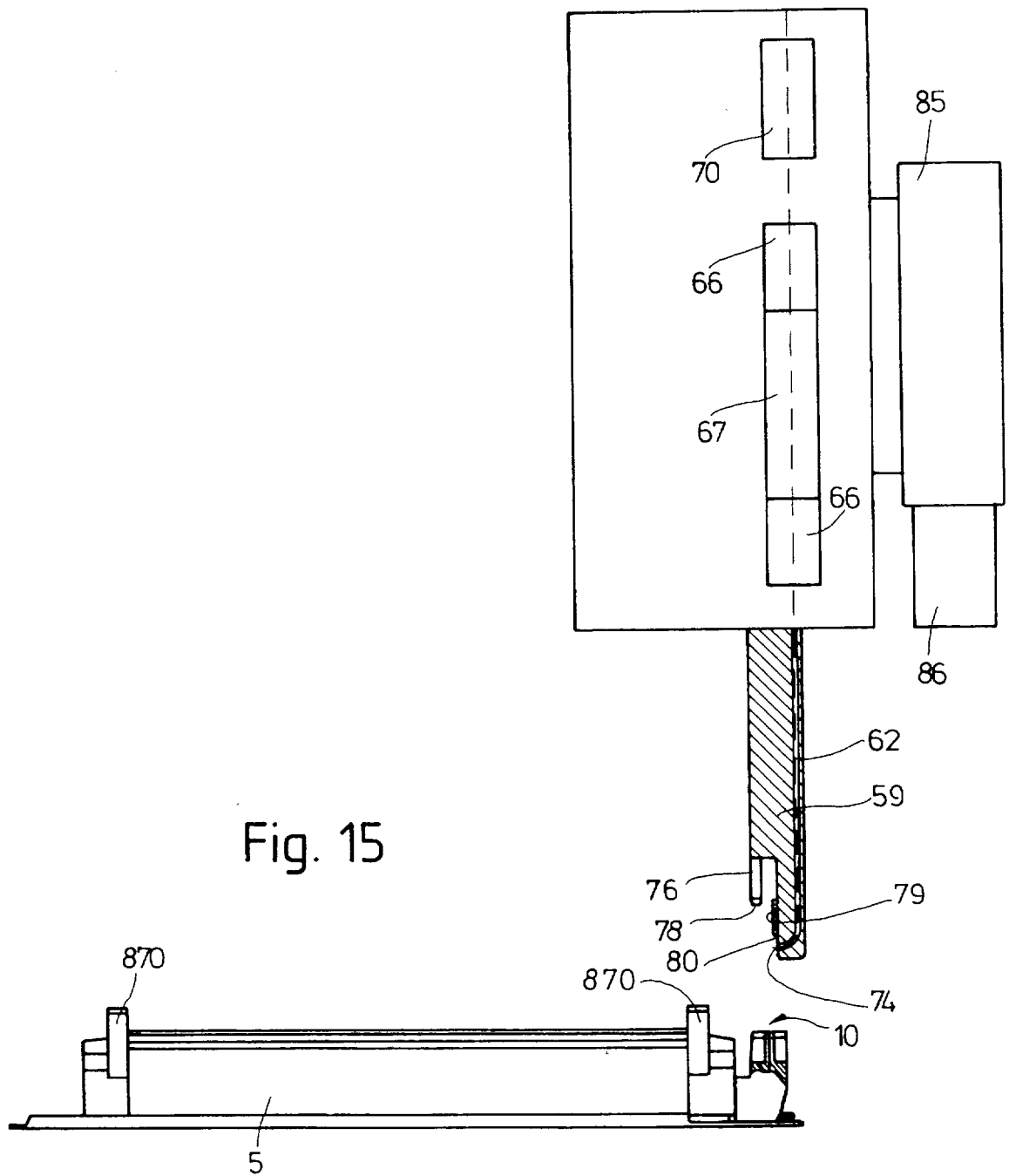
Figure 16:
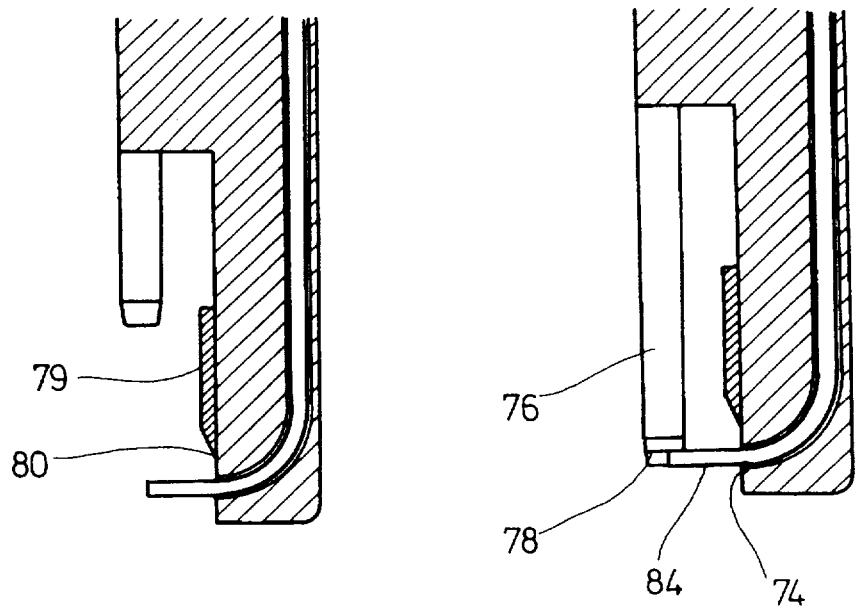

Finally, a clipper knife 79 is supported such that it can be raised and lowered on the vertical side face 60 of the laying prong 59; its associated drive mechanism, accommodated in the housing 58, is not shown in further detail. It can be advanced, by the knife edge 80 (FIG. 15) located on its lower end, out of the position of repose shown in FIGS. 14, 16, 17 into a working position shown in FIG. 27, in which it has smoothly clipped the end of the line 68 protruding from the mouth 74 of the line guide conduit 62. To that end, the knife edge 80 has overtaken the opening of the mouth 74, with the underside 81 of the edge of the mouth of the line guide conduit 62 acting as a counterpart knife, as can readily be seen from FIG. 27, for example.

In principle, embodiments in which the knife 79 is given its own counterpart knife, separate from the laying prong 59, are also possible.

With the aid of the line-laying means 31 described, which is moved by the industrial robot 33 (FIGS. 10, 11), for example, by a program along predetermined paths of movement, a preassembled light box 1, which is provided at predetermined points of the light box bottom 3 with the terminal 9, 10, 11 formed as described, is automatically wired in the following way, the description being made in conjunction with FIGS. 14–34:

An insulated line 68, for instance drawn in endless fashion from a supply coil 82 (FIG. 10), is threaded into the laying tool of the line-laying means 31. This line runs between the measuring wheel 70 and the contact roller 71 and between the two endless belts 67 of the belt drive and is fed by the belt drive through the guide tube 65 into the L-shaped line guide conduit 62. The belt drive has moved the forward end of the line 68 so far forward, in the manner that can be seen from FIGS. 12–17, that a segment 84 of it (FIG. 17) protrudes from the mouth 74 of the line laying conduit 62, this segment extending to beneath the pressure face 78 of the ram 76.

A preassembled light box 1 has been moved into the working position 47 of FIG. 10 into the operating range of the industrial robot 33 and firmly clamped there in the correct position on the work table 44 (FIG. 11). The ram 76 is in its raised position of repose shown in FIG. 16; the knife 79 is also in its position of repose above the mouth 74. The belt drive 66, 67 is not moving.

The industrial robot 33, controlled by program accordingly, takes the line-laying means 31 with the laying prong 59 from a remote position of repose into the vicinity of the first terminal, which in this case is a terminal 10 of the left-hand choke 5 of FIG. 1. In the process the laying prong 59 arrives approximately at the position of FIG. 14, in which it is located above and laterally offset from the terminal 10.

In this position of the laying prong 59, position sensing means located on the housing 58 and taking the form of an image processing system 85 are located with the picture taking device 86 of this system above the terminal 10. The image processing system 85 includes means for image evaluation, with the aid of which it calculates the positional deviation of the laying prong 59 from the terminal 10 and generates a suitable compensating control signal. This signal is processed in the control unit in such a way that the industrial robot 33—or a positioning system located between it and the line-laying means 31, similar to the positioning device 56 of FIG. 13—performs the requisite positional tolerance compensation and positions the laying prong 59 precisely in the correct position relative to the terminal 10. Once this has been achieved, the laying prong 59 assumes the position of FIG. 16, in which it is aligned accurately above the housing 12 and the groovelike indentations 26 thereof.

Figure 17:
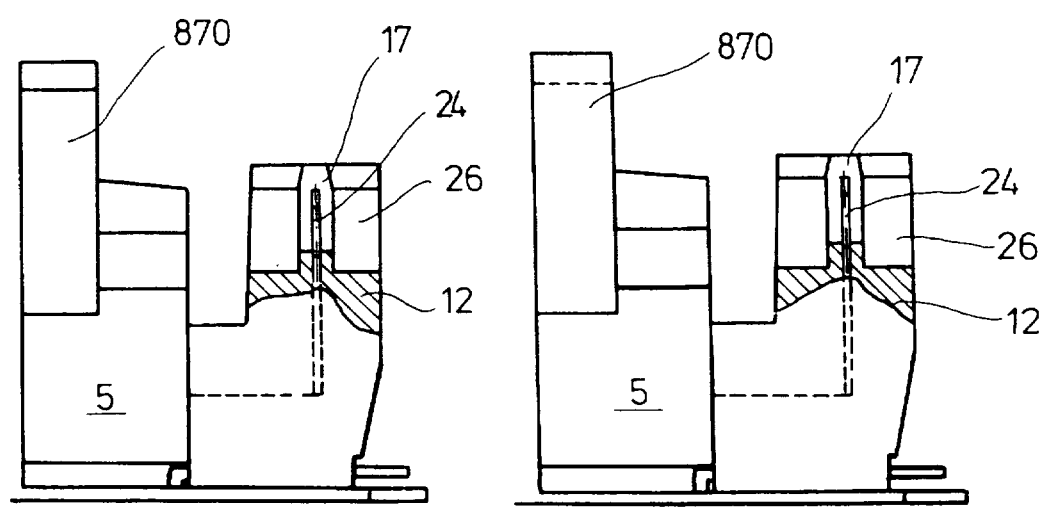

The ram 76 now moves to its lower operating position of FIG. 17, in which it rests with its pressure face 78, located on the bottom of a longitudinal groove, on the end segment 84 of the line, suitably far advanced out of the mouth 74 of the line guide conduit 92 and positions this segment precisely horizontally. The end segment 84 of the line can then be advanced farther if needed, as far as the end of the pressure face 78.

The laying tool of the line-laying means 31 and in particular their laying prong 59 and the ram 76 are simultaneously moved downward along the vertical Z axis. In the process, the horizontal end segment 84 of the line is pressed through the introduction slit 19 of the housing 12 at the terminal 10 into the IDC slit 23 of the IDC contact 25, until the line segment 84 locks into place in the widened portion 21 of the slit (FIG. 6). In this pressing-in motion, an equally great, uniform pressing-in force is exerted from the top of the line guide channel 62 and the pressure face 78 on both sides of the introduction slit 19 upon the horizontally retained end segment 84 of the line, so that this segment is unable to escape, and satisfactory insertion into the contacting zone of the terminal 10 is assured.

In this introduction and pressing-in motion, the insulation is cut open by the clipper edges on the legs 24 of the IDC element, and satisfactory contacting is produced. At the same time, the end segment 84 of the line is positionally firmly fixed by the two ribs 17 on both sides of the IDC contact 25, with slight deformation of its insulation occurring in the process.

The ram 76 and the laying prong 59 have essentially the same width on their front end at right angles to the plane of the drawing (FIG. 19), which is equivalent to the width of the groovelike indentations 26, so that a satisfactory mutual spatial association between the housing 12 and the laying prong 59 and the ram 76 when the line segment 84 is pressed in is assured. The elements now assume the position shown in FIG. 18.

Figures 18, 19:
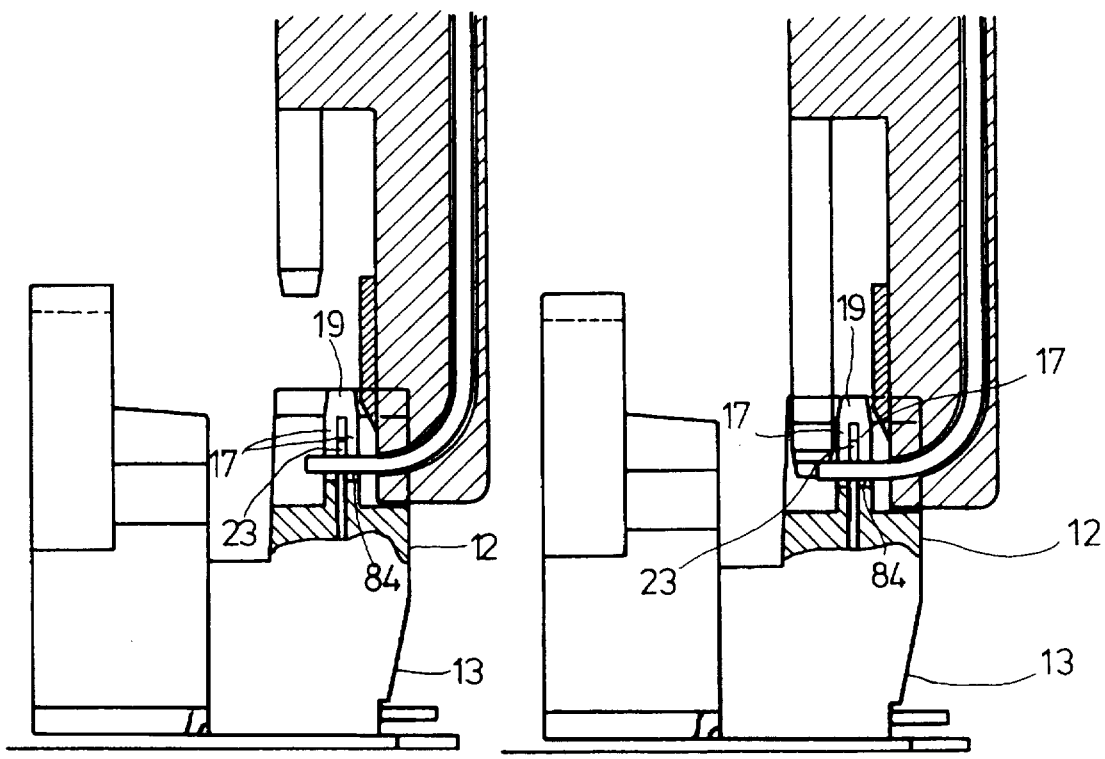

The ram 76 now moves upward into its final position or position of repose and releases the end of the line segment. This situation is shown in FIG. 19.

Since the end of the line segment 84 is received in the groovelike indentation 26 in the immediate vicinity of the guide groove 19, and this indentation has a length, width and height such that the free end of the conductor cannot be accidentally touched from outside, and since the IDC contact 25 is embedded in the insulating material of the housing 12 and is likewise enclosed all-insulated, i.e. protected against accidental contact from outside, satisfactory shock-hazard protection is already attained at the terminal 10.

Figure 20:
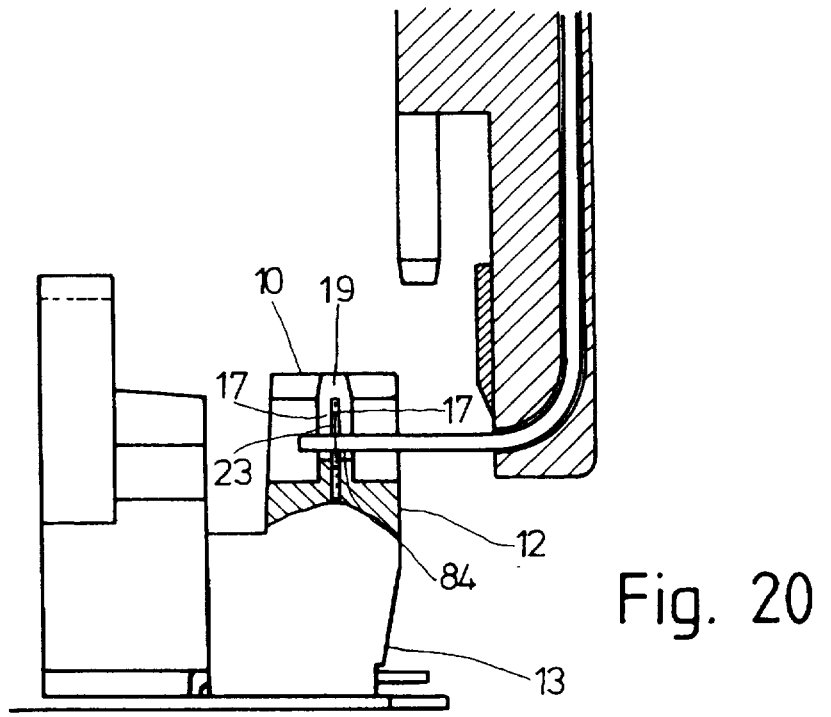
Figure 30:
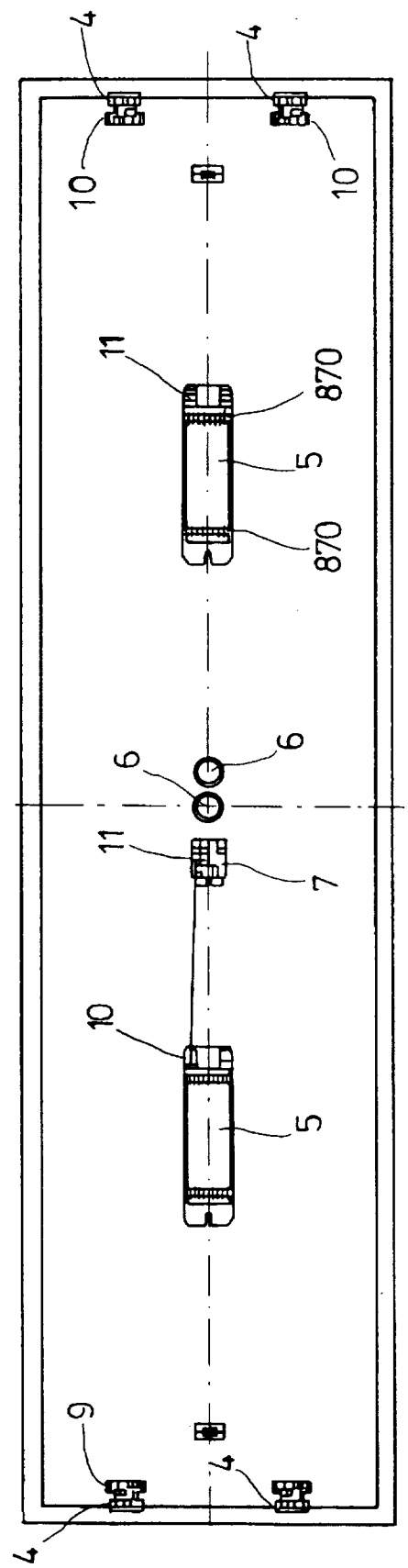

The control unit now controls the motion of the industrial robot 33 by program such that the laying prong 59 moves from the contacted terminal 10 to the next terminal—terminal 11—on the insulating material base 7 over the rectilinear laying course that can be seen in FIG. 30, in the process laying the line 8. This is illustrated in FIGS. 20, 21.

In the process, the belt drive 66, 67, controlled by the control unit, is actuated in synchronism with this displacement motion of the laying prong 59 such that tension-free laying of the line ensues. Optionally, in this displacement motion a vertical motion in the Z axis may also be imparted to the laying prong 59, for instance in order to place the laid line on the box bottom 3 (FIG. 1) or to compensate for a difference in height between the terminals 10, 11, as suggested in FIG. 22.

Figure 21:
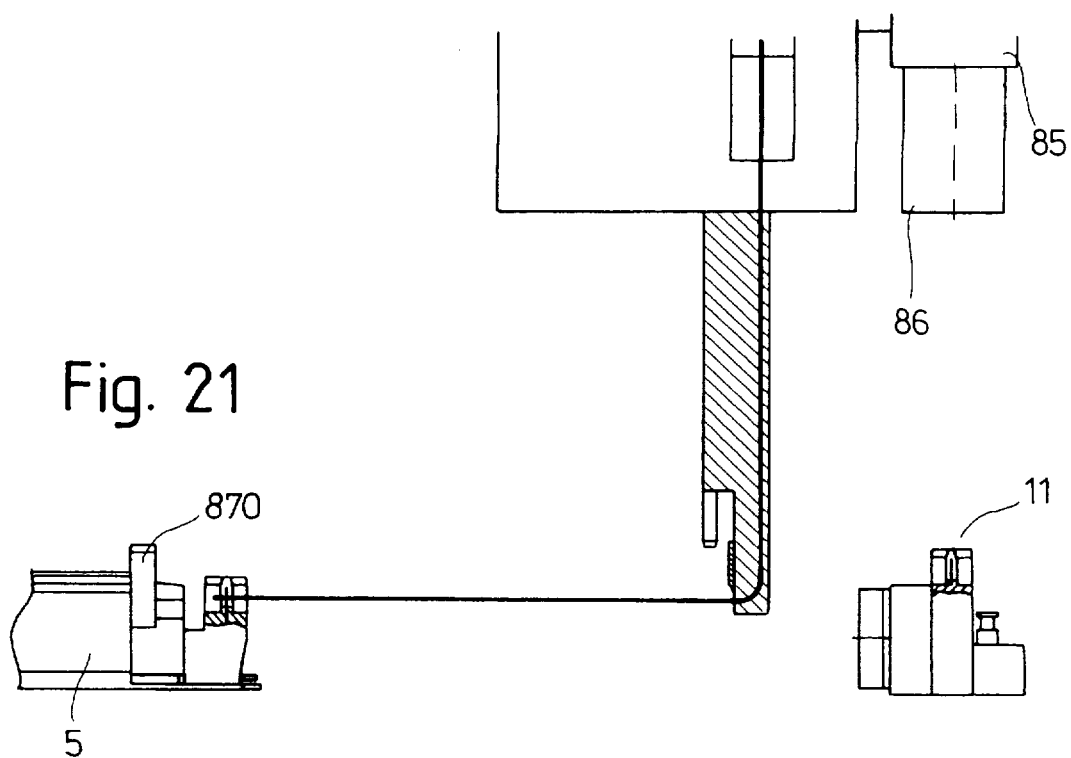
Figure 22:
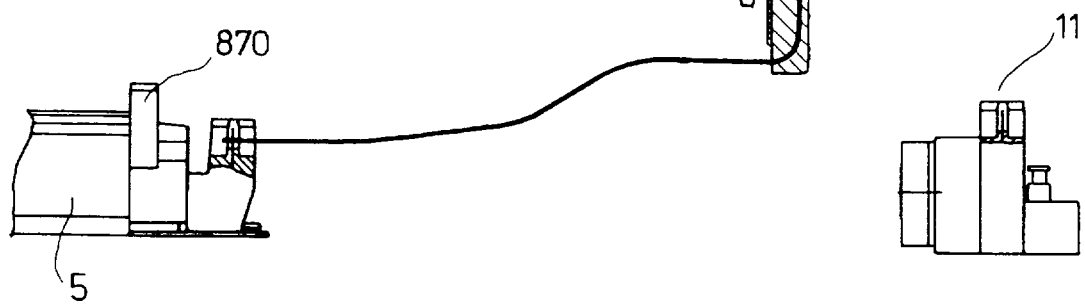

In the course of this displacement motion, the laying prong 59 is first merely brought to the vicinity of the terminal 11, to the position shown in FIG. 21 and FIG. 22, in which the image processing system 85 is located above the terminal 11 and can detect the spatial position of the terminal, which may certainly also be influenced by unavoidable tolerances in the assembly of the apparatus systems.

The image processing system 85 now, similarly to the process described above for the terminal 10, ascertains the positional deviation of the laying prong 59 from the terminal 11 and via the control unit of the industrial robot 33 brings about the positional tolerance compensation required for exact positioning of the laying prong 59 relative to the terminal 11. Once this operation has been concluded, the elements assume the position shown in FIGS. 23 and 24.

The ram 76 is now lowered from its final position or position of repose into the working position, in which it rests with its pressure face 78 on the part of the line 68, guided horizontally here, that is emerging from the mouth 74 of the line guide conduit 62; see FIG. 25.

Next, the laying prong 59 and the ram 76 are lowered simultaneously and in a fixed association both to one another and to the housing 12 of the terminal 11; the line segment 84a extending between the pressure face 78 and the top of the edge of the mouth 74 is pressed, supported at two points on both sides of the contacting zone, into the introduction slit 19 and the IDC slit 23, until it reaches the detent position already described in conjunction with FIGS. 18 and 19. The line 68 is thus perfectly contacted at its line segment 84a and is firmly clamped and fixed next to the contact point on both sides of its insulation in the guide slit 19.

In the present wiring process, the line laid in the manner described is clipped at the terminal 11. This is done with the knife 79, which moves downward and severs the line 68 directly at the mouth 74 of the line guide conduit 62, with the edge of this mouth acting as a counterpart knife. The elements now assume the situation shown in FIG. 27.

When the line 68 is clipped in this way, the end of the laid segment of line, retained in the guide slit 19 of the terminal 11, is bent downward, as FIG. 27 shows, from the oblique face 86 adjoining the cutting edge 80 of the knife 79. This means that the bare end face of the conductor, at the cut face, is aimed toward the bottom of the surrounding groovelike indentation 26, and consequently the shock-hazard protection is substantially increased. At the same time because of this bend a further mechanical fixation of the end of the line at the terminal 11 is obtained.

Figure 28:
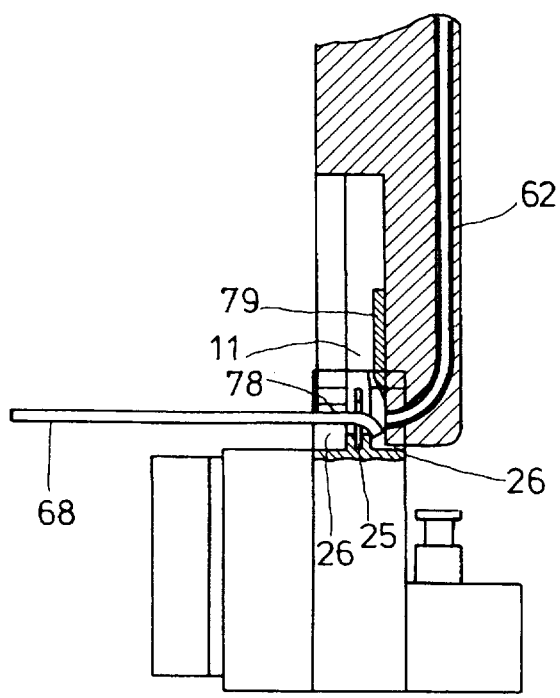

This concludes the process of wiring between the two terminals 10 and 11. The knife 79 returns to its final position or position of repose, as shown in FIG. 28.

Figure 29:
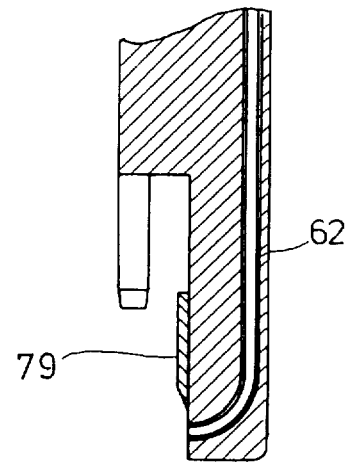

Next, the ram 76 is returned to its final position or position of repose, and the laying prong 59 is moved upward by the industrial robot 33, whereupon the outset position for the next wiring step in the light box 1 is already reached. This starting position is shown in FIG. 29.

Depending on the wiring to be done, the line 68 may also be through-wired at the terminal 11, as an example. In that case clipping of the line as in FIGS. 27 and 28 is not done; instead, following the situation shown in FIG. 26, the ram 76 is returned to its final position or position of repose (see FIGS. 19, 20), whereupon the control unit as programmed causes the industrial robot 33, the line-laying means 31 and thus the laying prong 59 to move along a preprogrammed defined path to the next terminal. This will be briefly described now in conjunction with FIGS. 31–33:

The next following terminal is again a terminal 10, but now that of the right-hand choke 5 in FIG. 1. The line must be moved past the choke 5. The choke 5, as can be seen particularly from FIG. 2, is equipped in the region of both ends, at the top, with two retaining elements 870 for lines 68. Each of the comblike retaining elements 870 is provided with a row of parallel, continuous detent grooves 88 of semicircular cross section, into each of which one line 68 can be pressed via an introduction slit 89.

In the line laying between the terminals 11, 10 (FIGS. 26 and 31), the industrial robot 33 therefore, along a preprogrammed path, takes the laying prong 59 first to the vicinity of the respective retaining element 870. Once positioning of the laying prong 59 has been done in the manner already described, by means of the image processing system 85, the ram 76 moves downward and either alone or jointly with the laying prong 59 presses the line into one of the detent grooves 88. Next, the ram 76 is returned to its final position or position of repose; the laying prong 59 moves upward and is moved to the next subsequent retaining element 870, where the same process is repeated.

Following this, the laying prong 59 is moved to the vicinity of the terminal 10 and positioned above it in the manner already described, whereupon the ram 76 is again moved forward until its pressure face 78 rests on the line segment 84a emerging from the mouth 74. The elements assume the situation shown in FIG. 32.

In the now-ensuing lowering motion of the laying prong 49 of the ram 76, not only is the line segment 84a fixed in the introduction slit 19, horizontally aligned and perfectly supported, in the manner already described and contacted in the IDC slit 23, but at the same time the line 68 is also bent downward to the level of the IDC contact 25. Once the contacting is concluded, the elements assume the position of FIG. 33.

As the next step, the line 68 can either be clipped (as in FIG. 27), or alternatively it is through-wired to the next following terminal, for instance a terminal 9 of a lamp base 4.

Since for the lamp base 4 the introduction slits 19 are aligned with the terminals 9 transversely to the longitudinal direction of the light box, the industrial robot 33 must rotate the line-laying means 31 and here in particular the housing 58 of the laying tool 57 having the laying prong 59 and the ram 76, about the vertical axis (c axis) by 90°, before the then-bent line portion is introduced into the introduction slit 19 in the manner already described.

Figure 31:
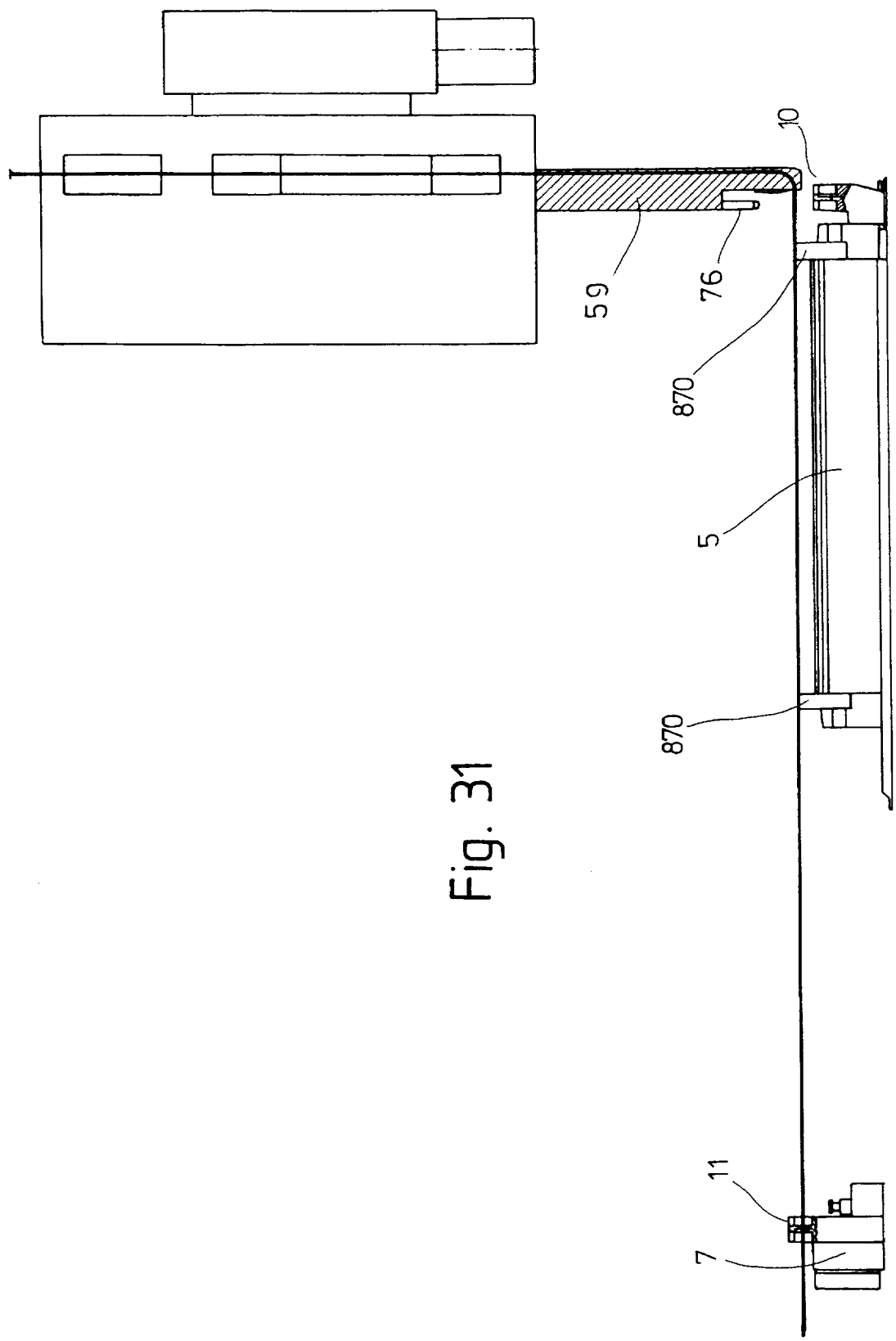
Figure 32:
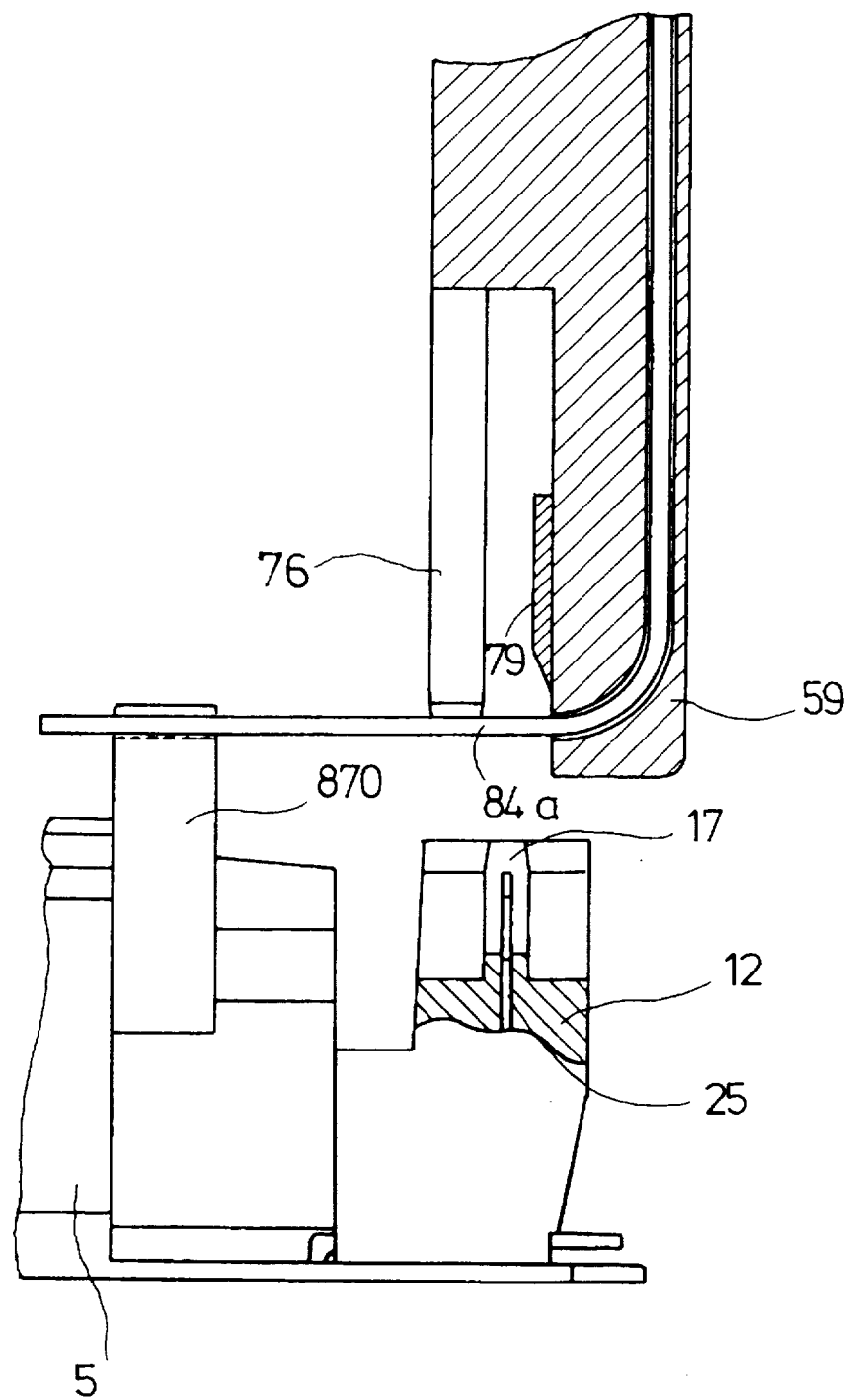
Figure 33:
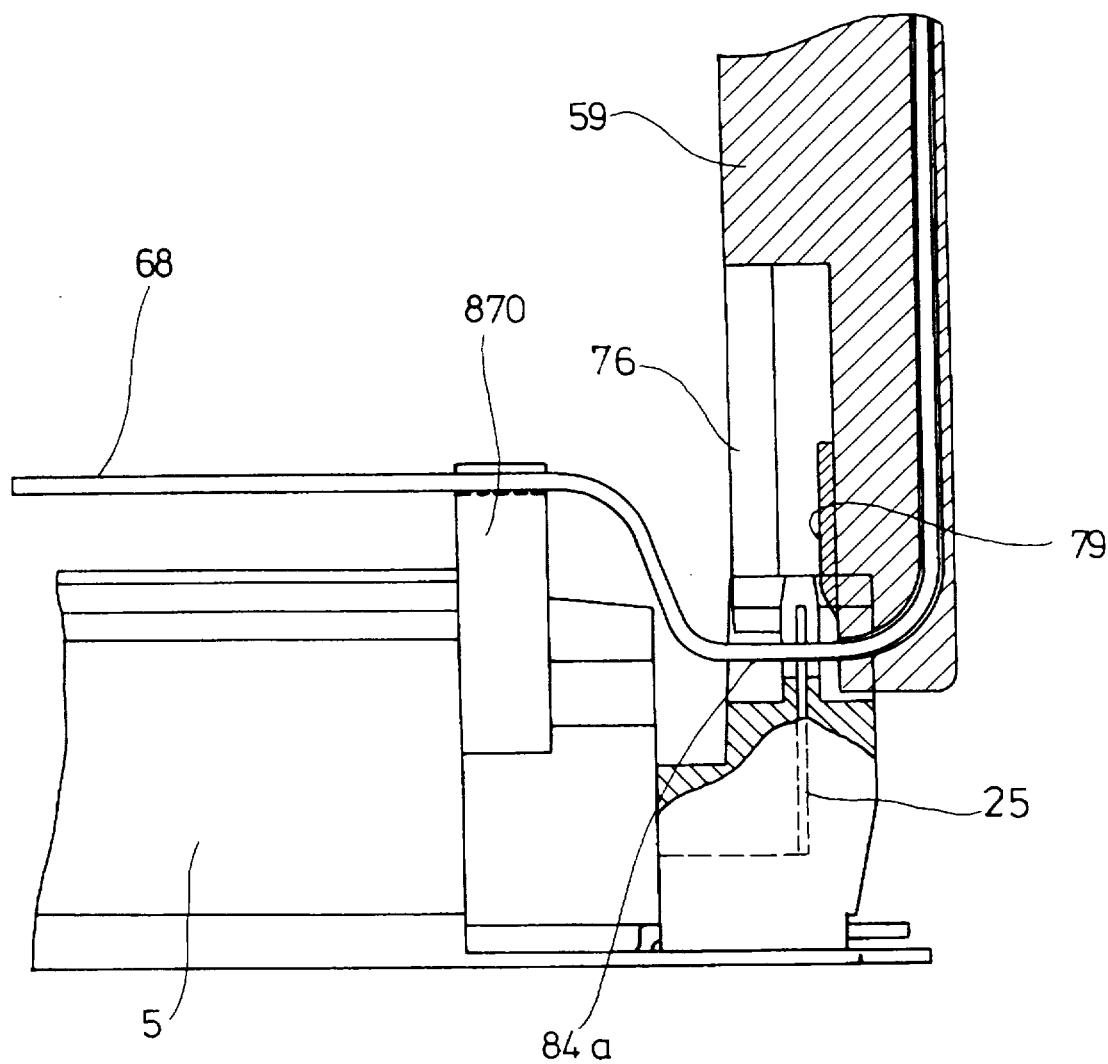
Figure 34:
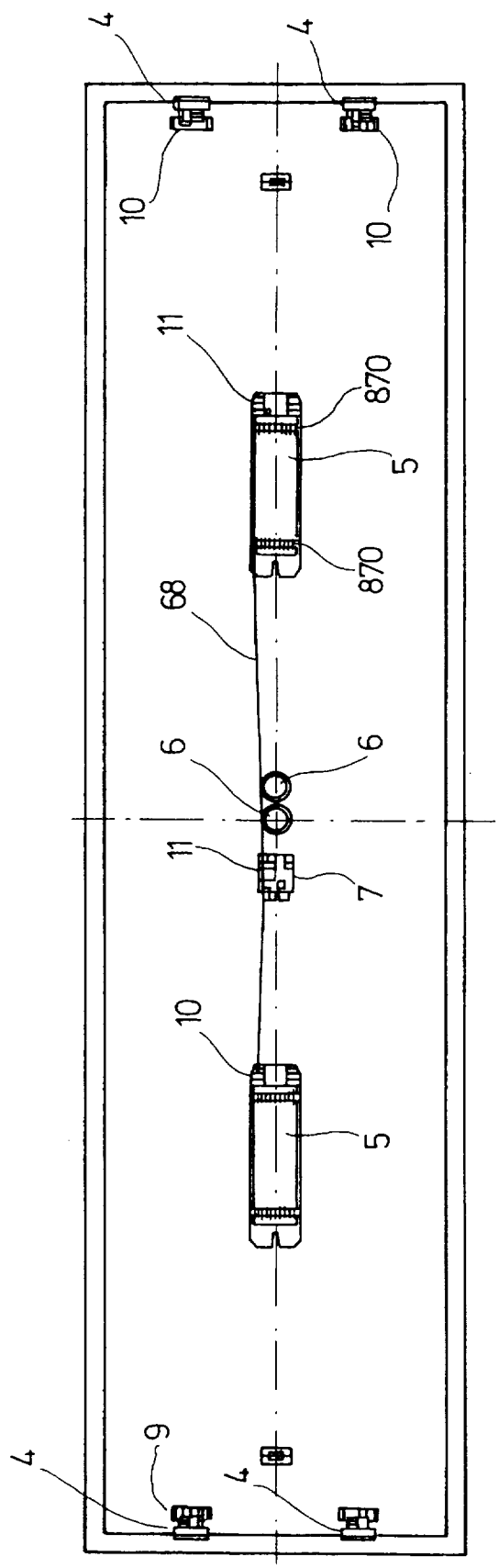

The direct wiring, carried out by the method steps described, of the preassembled light box 1 is shown in FIGS. 33, 34 for the following two cases: First, the line 68 is clipped once it reaches the terminal 11 (FIG. 27), and second, it is through-wired beyond this terminal (FIG. 31).

We claim:

1. A method for wiring terminals of electrical apparatuses (5, 8) of apparatus systems (1) with the aid of a controlled mechanical line-laying means (31), comprising the steps of:
providing a preassembled electric apparatus system which includes the electric apparatuses, said apparatuses having terminals fixedly located thereon,
said terminals comprising a contacting zone including a contact element (25) and a constricted guide region (26) of insulating material;
relatively moving a first one of said terminals and the line-laying means (31) into operating range and correctly relatively positioning the preassembled apparatuses and the line-laying means by means of relative motion therebetween;
supplying the end of a line (68) from a line supply means (82) to the line-laying means (31), and introducing said end into the contacting zone of the first terminal to affix said end at that terminal and produce an electrical contact with the contact element (25);
relatively moving, along a predetermined path, the preassembled electrical apparatuses and the line-laying means, and bringing every other terminal successively into operating range of the line-laying means, thereby laying the line, and positioning the line directly relative to the preassembled apparatuses,
positively supplying, during each of these relative movements, from the line-laying means at least a length of the line that corresponds to the distance between said first terminal and a second successive terminal along a line laying course;
introducing, by means of the line-laying means, the line at each terminal into the contacting zone of the respective terminal, affixing the line to the respective terminal, and producing an electrical contact; and
then, without further positioning movement of the line-laying means, cutting off the thus-laid line at the end of the line-laying course by said line-laying means, in the region of the last terminal to be contacted at a position within said guide region (26) and inwardly of one end surface thereof.

2. The method of claim 1, including the step of
bringing, a support or retention element into the operating range of the line-laying means; positioning the line correctly relative to said support or element, and
introducing, by means of the line-laying means, line into a line mount at the support or retention element and securing the line to said support or retention element.

3. The method of claim 1, wherein said moving step comprises
moving the line-laying means by a multiaxially movable manipulator or industrial robot, whose movement is programmable in at least one axis; and
wherein the preassembled electric apparatuses are located in a stationary position prior to moving the line-laying means.

4. The method of claim 1, wherein
the line-laying means are located at a predetermined location, optionally at a positioning device imparting a positioning motion to them; and
wherein the preassembled electrical apparatuses are moved by means of a transport means that is movable relative to the line-laying means.

5. The method of claim 1, comprising the step of
synchronizing the line length supplied during line-laying between two terminals by the line-laying means with the relative motion between the preassembled apparatuses and the line laying means,
whereby since the beginning of the line is fixed at the first terminal at the onset of laying a line, tension relief required in direct laying of the line is attained automatically.

6. The method of claim 5, wherein the length of the line length supplied by the line-laying means is dimensioned of such length that the line laid between the terminals is completely free of tensile strain.

7. The method of claim 1, wherein said moving step comprises controlling the relative motion between the preassembled electrical apparatuses and the line-laying means, such that the line-laying means approaches the vicinity of the respective terminal, and
then positioning the line-laying means precisely in a line inserting position relative to the terminal.

8. The method of claim 7, including the step of ascertaining the positional deviation of the line-laying means from the position of the terminal with the aid of position sensing means after the line-laying means have been brought into the vicinity of the terminal, and
automatically compensating for any positional deviation.

9. The method of claim 8, wherein the step of ascertaining the positional deviation includes
providing an image processing system, assigned to the line-laying means; and
moving said image processing system for taking an image close to the terminal; and
further including the step of calculating compensation for the positional deviation, and providing a corresponding output control signal.

10. The method of claim 1, including after the step of positioning the line-laying means, the step of
imparting an introduction motion of a defined course length to the line in the region of the terminal, with which motion the line is brought into the contacting zone of the terminal.

11. The method of claim 1, wherein the relative motion between the preassembled electrical apparatuses or apparatus system and the line-laying means is, at least intermittently, substantially rectilinear.

12. The method of claim 1, wherein the contact elements in the contacting zones are IDC contact means;

the line is pressed by the line-laying means into these contact elements; and including the step of supporting the line, during the cutting operation by said line laying means.

13. The method of claim 12, wherein the line, upon being pressed in the contact means, is subjected to a pressing-in force on both sides of the IDC contact means.

14. The method of claim 12, wherein the line is firmly clamped on at least one side of the IDC contact means.

15. The method of claim 1, including the step of cutting the line directly at the line-laying means.

16. The method of claim 12, including the step of cutting the line at the IDC contact means.

17. The method of claim 12, including the step of cutting the line between spaced IDC contact means of an apparatus, while the line is in the contacting zone.

18. The method of claim 1, including the step of cutting the line such that the end thereof is protected in the guide region (26), whereby the end will be automatically shock-hazard-proof protected and no further positional movement of the line-laying means is required.

19. The method of claim 1, wherein the apparatus system comprises a light fixture.

20. Line-laying means, particularly for carrying out the method of claim 1, comprising a line-laying tool (31) having a housing (59) defining a working side;

a guide conduit (62) for the line (68) on the working side of the housing, terminating in a mouth of a laying prong;

controlled feed means (66, 67) for the line;

at least one pressure member (76), located in the vicinity of the mouth (74) of the guide conduit (62) for the line (68) emerging from the mouth (74), said pressure member being movably supported for movement substantially transversely to the axial direction of the guide conduit (62) in the mouth region;

positioning means on the pressure member for positioning the pressure member between a remote position of repose distant from the mouth (74) and an operating position, in which operating position the pressure member protrudes on one side spaced from and past an edge of a mouth of the guide conduit (62) with a pressure face (78) aligned with the line (84) protruding from the mouth (74), or substantially flush with the top of the edge of the mouth;

controlled wire cutting means (79) slidably movably located on the housing (59) adjacent the pressure member; and a slide surface for said wire cutting means (79) formed on the housing, and wherein said mouth (74), terminating the guide conduit (62) is located in said slide surface, whereby an end portion of said line (68) projecting from said mouth will be cut cleanly and a bottom side (81) of the edge of the mouth (74) of said guide conduit will form a counterelement for the cutting force of said cutting means whereby said pressure member can insert the line into a contact element (25) and the cutting means (79) can cut the line at a position within a constricted, protected guide region (26) of a terminal without further movement of said line-laying means.

21. The line-laying means of claim 20, wherein the pressure member is a ram (76) longitudinally displaceably guided on the housing (58).

22. The line-laying means of claim 21, wherein the line-laying means includes a laying prong (59); and the ram (76) is located parallel to and spaced apart from the laying prong (59).

23. The line-laying means of claim 22, wherein the mouth (74) of the guide conduit (62) is located laterally on the laying prong (59) and on the side toward the pressure member (76).

24. The line-laying means of claim 22, wherein the pressure member (76) and the laying prong (59) have, at least in part, essentially the same width, measured transversely to the longitudinal direction of the line (68) emerging from the mouth (74) of the guide conduit (62).

25. The line-laying means of claim 20, wherein the controlled cutting means (79) for cutting the line (68) comprises at least one cutter blade (79) movably located in the region between the mouth (74) of the guide conduit (72) and the pressure member (76).

26. The line-laying means of claim 23, wherein the cutting means comprises a cutter blade (79) which is operatively supported immediately on the laying prong (59), and an edge portion (81) of the mouth (74) of the line guide conduit (62) is formed as a knife counterelement.

27. The line-laying means of claim 23, comprising adjusting means coupled to the laying prong (59); and wherein the laying prong (59) is movably supported on the housing (57).

\* \* \* \* \*